US012701666B2

(12) United States Patent
Neumann et al.

(10) Patent No.: US 12,701,666 B2
(45) Date of Patent: Aug. 4, 2026

(54) INTEGRATED SEPARATOR DEVICES FOR HARDWARE COMPONENT SEPARATION

(71) Applicant: Intel Corporation, Santa Clara, CA (US)

(72) Inventors: Daniel Neumann, Beaverton, OR (US); Andrew Larson, Hillsboro, OR (US); Eric Buddrius, Hillsboro, OR (US); Jeffory Smalley, East Olympia, WA (US); Shelby Ferguson, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 17/956,598

(22) Filed: Sep. 29, 2022

(65) Prior Publication Data

US 2023/0019643 A1     Jan. 19, 2023

(51) Int. Cl.
*H05K 5/02*        (2006.01)

(52) U.S. Cl.
CPC ................................. *H05K 5/0204* (2013.01)

(58) Field of Classification Search
CPC ............. H01L 23/4093; H01L 23/4006; H01L 2023/4081; H01L 2221/6839; H05K 7/1431; H05K 13/0491; H05K 2201/09127
See application file for complete search history.

(56) References Cited

U.S. PATENT DOCUMENTS

| | | | |
|---|---|---|---|
| 11,449,111 B2 * | 9/2022 | Buddrius | ............ H01L 23/4006 |
| 2019/0302857 A1 * | 10/2019 | Buddrius | ............. G06F 1/1658 |
| 2019/0304869 A1 * | 10/2019 | Larson | ................ H01L 23/4093 |
| 2019/0304871 A1 | 10/2019 | Laido et al. | |
| 2019/0306985 A1 * | 10/2019 | Ferguson | ............. H01R 12/88 |
| 2020/0137896 A1 | 4/2020 | Elenitoba-Johnson et al. | |
| 2021/0320050 A1 | 10/2021 | Robinson et al. | |

FOREIGN PATENT DOCUMENTS

| | | |
|---|---|---|
| GB | 2576032 | 4/2020 |
| GB | 2576030 | 12/2020 |
| GB | 2597525 | 2/2022 |
| GB | 2601357 | 6/2022 |

OTHER PUBLICATIONS

European Patent Office, "Extended European Search Report," issued in connection with European Patent Application No. 23187346.4, dated Feb. 20, 2024, 12 pages.
European Patent Office, "Communication under Rule 71(3) EPC," issued in connection with European Patent Application No. 23187346.4 dated Feb. 24, 2025, 9 pages.

* cited by examiner

*Primary Examiner* — James Wu
(74) *Attorney, Agent, or Firm* — Hanley, Flight & Zimmerman, LLC

(57) ABSTRACT

Example integrated separator devices for hardware component separation are disclosed herein. An example apparatus include a processor carrier having an inner edge and an outer edge; and a component separator rotatably coupled to the processor carrier, the component separator including a shaft, an entirety of the component separator closer to a center of the processor carrier than the outer edge is to the center of the processor carrier.

25 Claims, 24 Drawing Sheets

EDGE DATA CENTER(S) 106
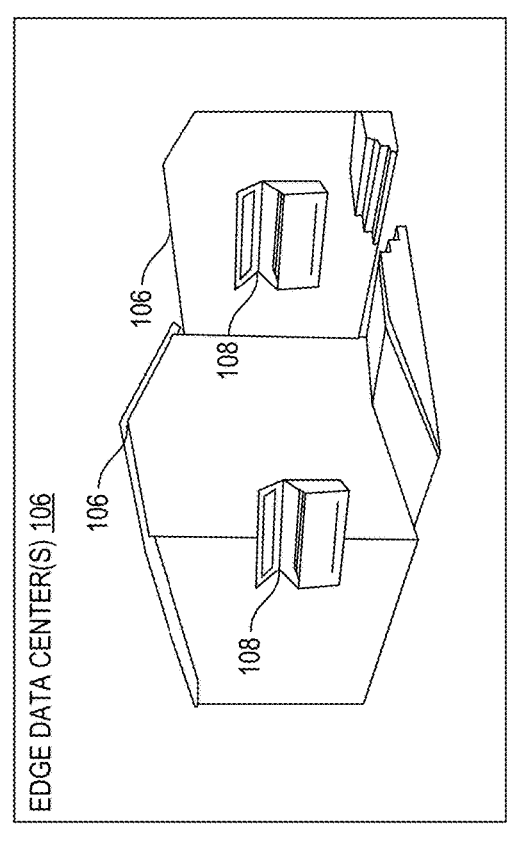
CONTENT DELIVERY NETWORK (CDN) DATA CENTERS 116
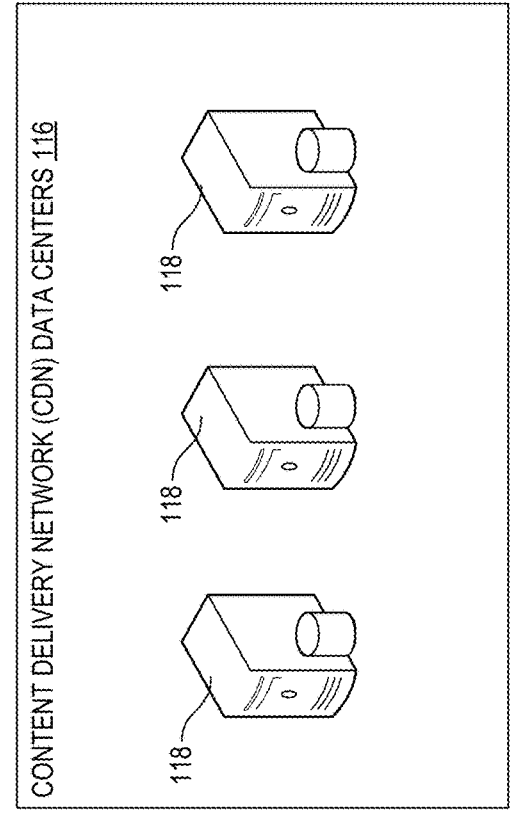
CENTRAL DATA CENTER(S) 102
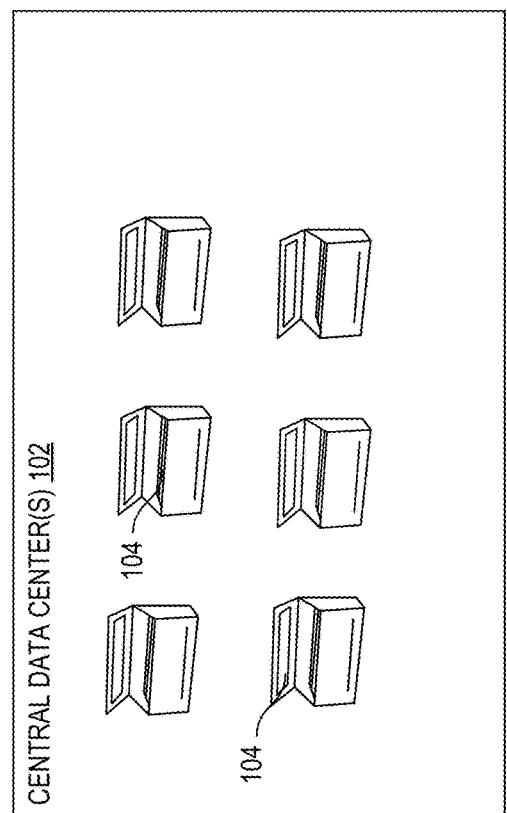
BUSINESS/INDUSTRIAL BUILDING(S) INCLUDING IT EQUIPMENT SPACE 110
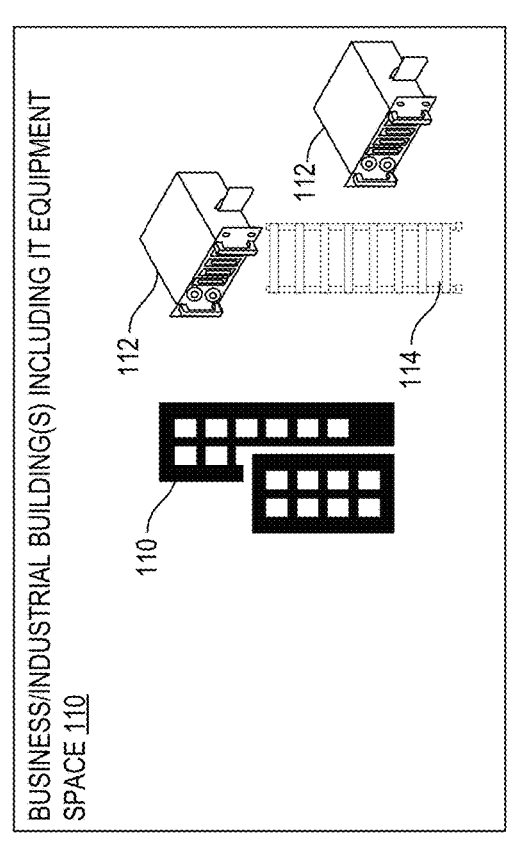
FIG. 1

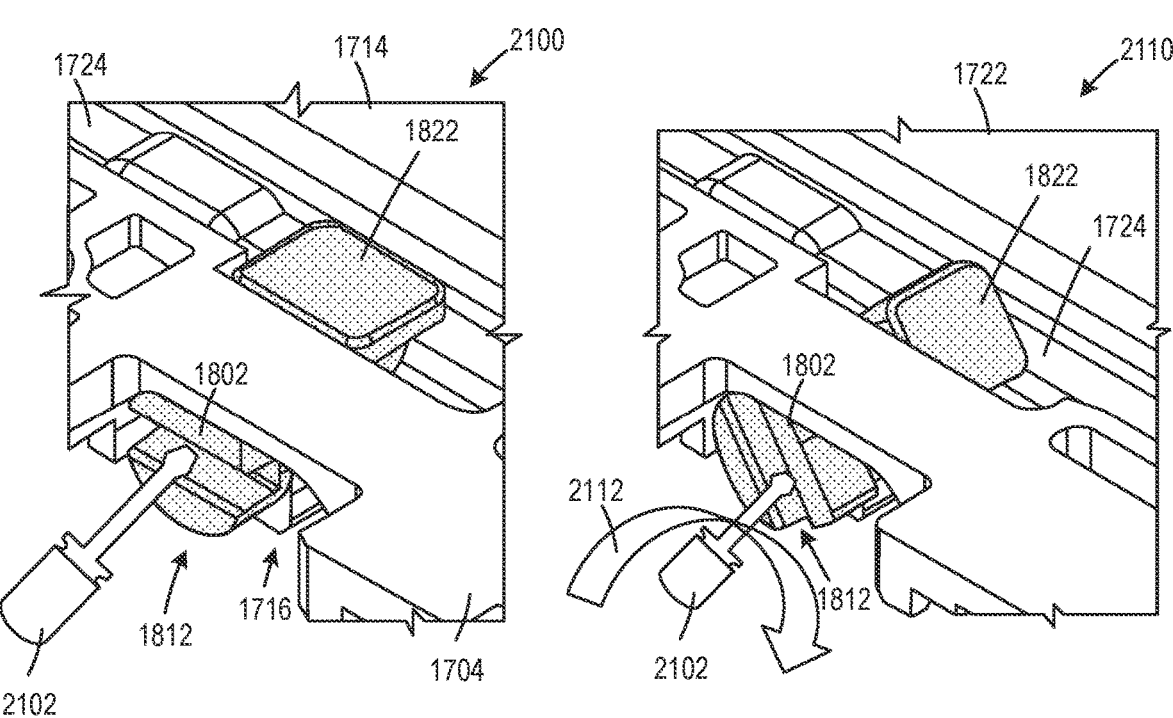
FIG. 21A                    FIG. 21B
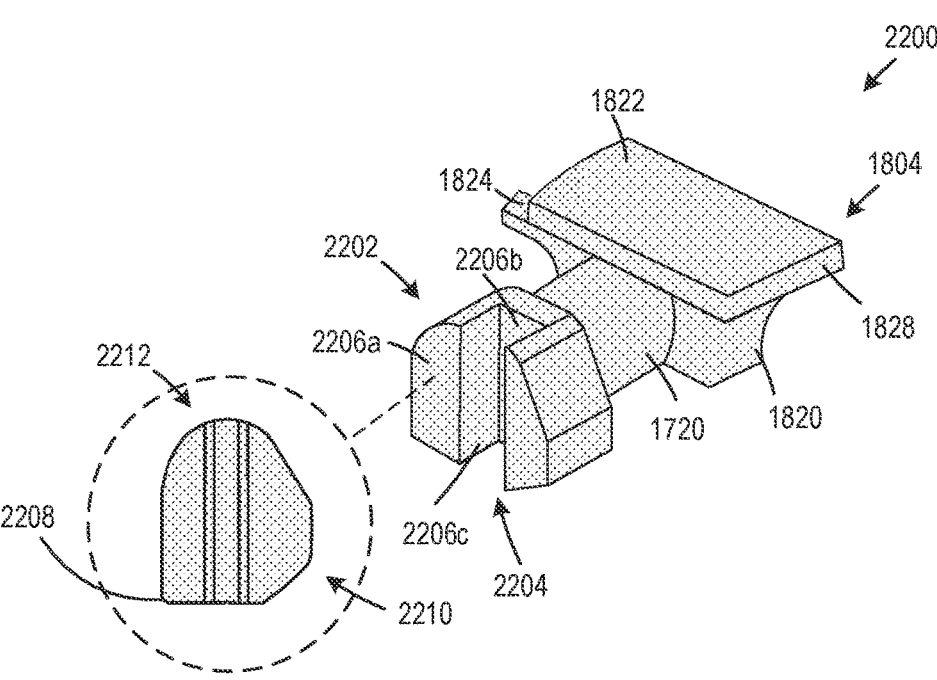
FIG. 22

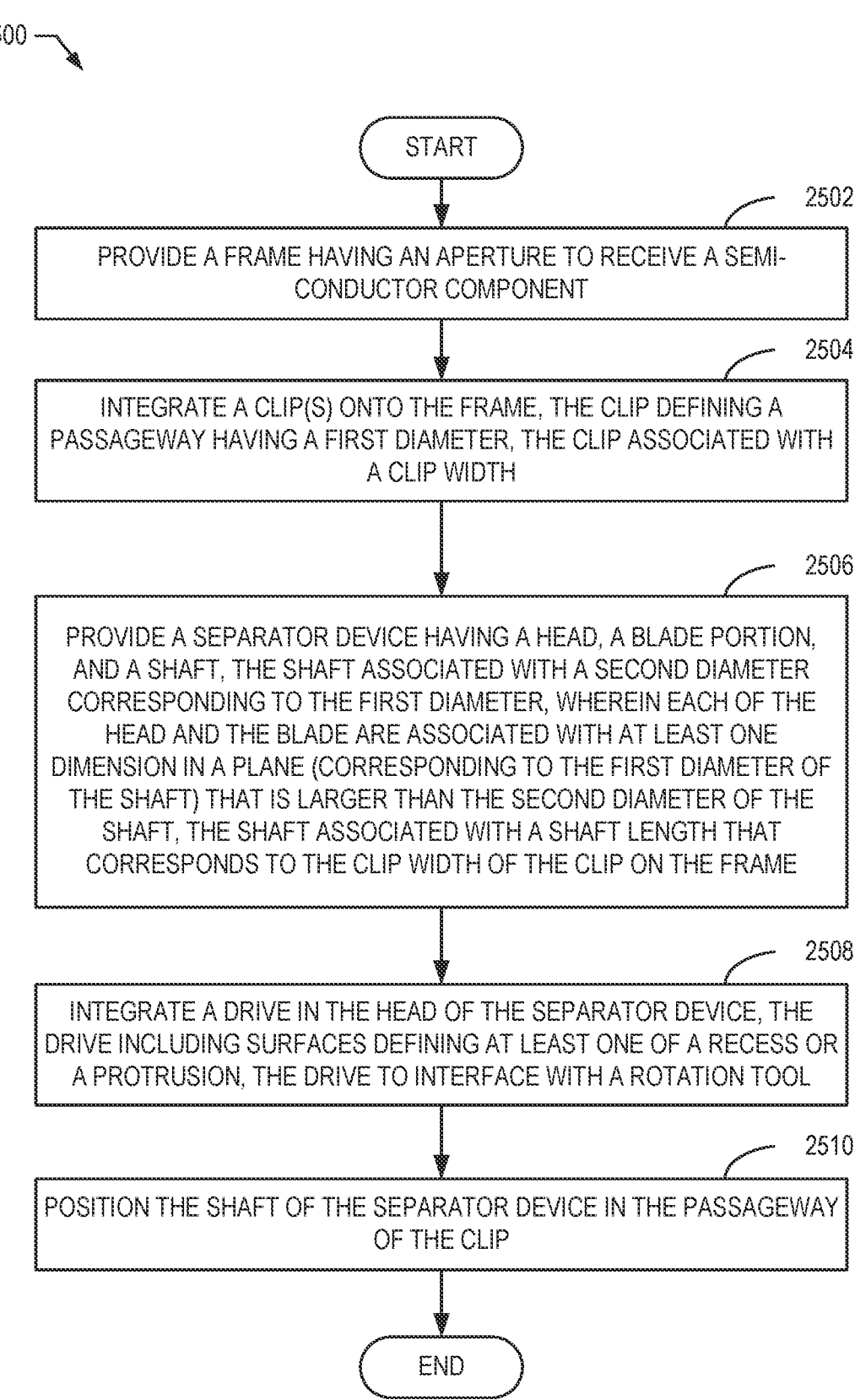

2500

START

2502

PROVIDE A FRAME HAVING AN APERTURE TO RECEIVE A SEMI-CONDUCTOR COMPONENT

2504

INTEGRATE A CLIP(S) ONTO THE FRAME, THE CLIP DEFINING A PASSAGEWAY HAVING A FIRST DIAMETER, THE CLIP ASSOCIATED WITH A CLIP WIDTH

2506

PROVIDE A SEPARATOR DEVICE HAVING A HEAD, A BLADE PORTION, AND A SHAFT, THE SHAFT ASSOCIATED WITH A SECOND DIAMETER CORRESPONDING TO THE FIRST DIAMETER, WHEREIN EACH OF THE HEAD AND THE BLADE ARE ASSOCIATED WITH AT LEAST ONE DIMENSION IN A PLANE (CORRESPONDING TO THE FIRST DIAMETER OF THE SHAFT) THAT IS LARGER THAN THE SECOND DIAMETER OF THE SHAFT, THE SHAFT ASSOCIATED WITH A SHAFT LENGTH THAT CORRESPONDS TO THE CLIP WIDTH OF THE CLIP ON THE FRAME

2508

INTEGRATE A DRIVE IN THE HEAD OF THE SEPARATOR DEVICE, THE DRIVE INCLUDING SURFACES DEFINING AT LEAST ONE OF A RECESS OR A PROTRUSION, THE DRIVE TO INTERFACE WITH A ROTATION TOOL

2510

POSITION THE SHAFT OF THE SEPARATOR DEVICE IN THE PASSAGEWAY OF THE CLIP

END

FIG. 25

INTEGRATED SEPARATOR DEVICES FOR HARDWARE COMPONENT SEPARATION

FIELD OF THE DISCLOSURE

This disclosure relates generally to processor assemblies and, more particularly, to integrated separator devices for hardware component separation.

BACKGROUND

A processor or processor package includes a processor die, a package substrate, and an integrated heat spreader (IHS) to protect the processor die and to provide a pathway for heat transfer from the processor. To enhance cooling of the processor, a heat dissipating device (e.g., a heatsink) is often placed over the processor and interfaced with the IHS. A layer of a thermal interface material (TIM) may be disposed between the heatsink and the IHS to hinder heat dissipation resistance caused by a thermal boundary at the interface of the heatsink and the IHS. The TIM may act as an adhesive, bonding the processor to the heatsink.

BRIEF DESCRIPTION OF THE DRAWINGS

FIG. 1 illustrates one or more example environments in which teachings of this disclosure may be implemented.

FIGS. 21A-21B are partial isometric views of an example implementation of the separator device of FIGS. 17-20 in accordance with teachings of this disclosure.

FIG. 22 illustrates another example separator device constructed in accordance with teachings of this disclosure.

FIG. 25 is a flowchart representative of an example method of manufacturing the example sub-assembly of either FIGS. 19-21B or FIGS. 23A-24D.

Figure 2:
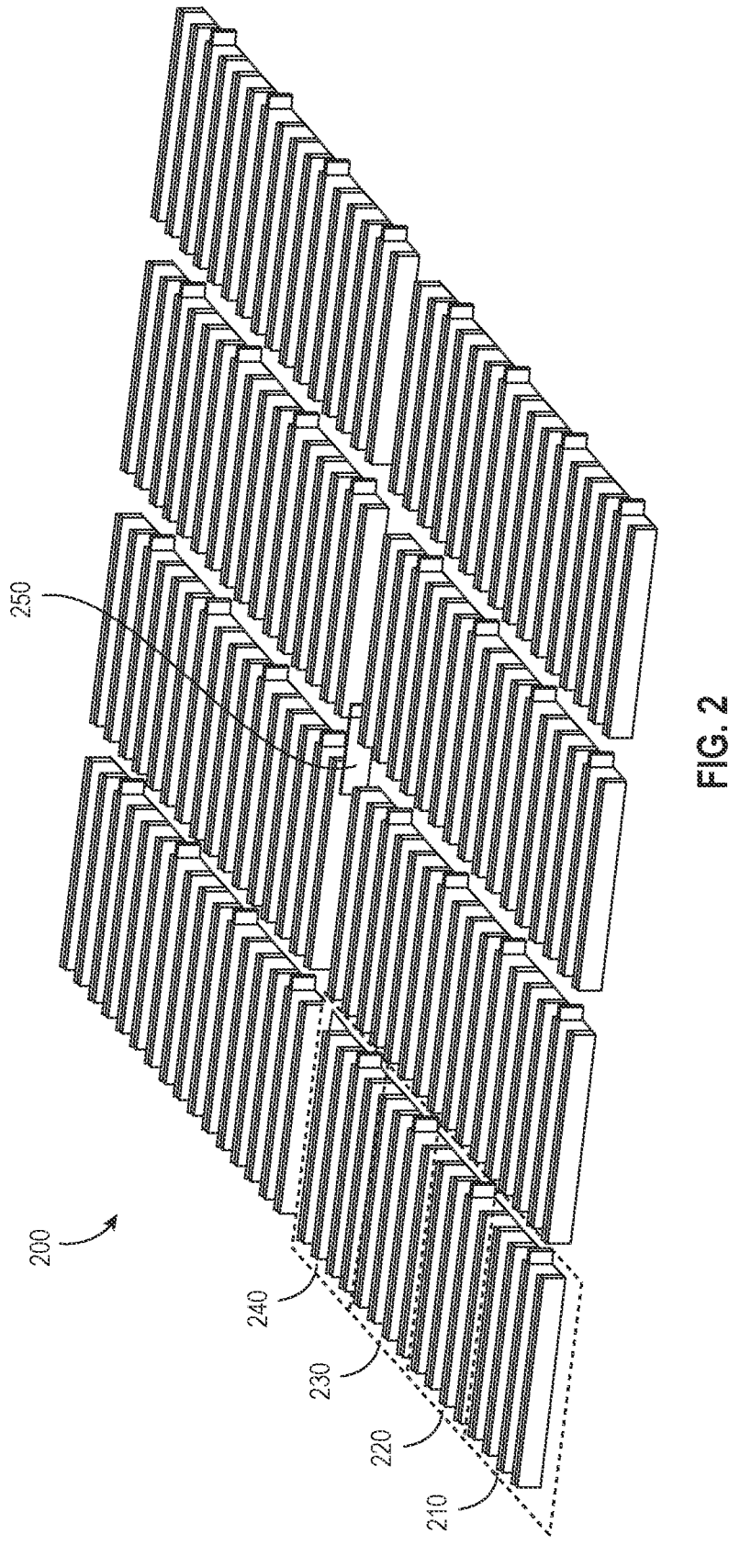
FIG. 2 illustrates at least one example of a data center for executing workloads with disaggregated resources.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of ±10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, the term "processing device" or "processor" may refer to any device or portion of a device that processes electronic data from registers and/or memory to transform that electronic data into other electronic data that may be stored in registers and/or memory. The "processor" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). The processor may include one or more programmable microprocessors, Field Programmable Gate Arrays (FPGAs) that may instantiate instructions, Central Processor Units (CPUs), Graphics Processor Units (GPUs), Digital Signal Processors (DSPs), XPUs, microcontrollers and integrated circuits such as Application Specific Integrated Circuits (ASICs), cryptoprocessors (specialized processors that execute cryptographic algorithms within hardware), server processors, any other suitable processing devices, and/or a combination thereof.

As disclosed herein, a processor (e.g., processor package, an integrated circuit package) may include one or more example dies that are coupled to an example substrate and encapsulated by an integrated heat spreader for protection. The processor may include interconnects between the die(s) and leads, pins, or bumps located on external portions of the substrate.

DETAILED DESCRIPTION

A processor may be part of a processor heatsink (PH) assembly in which the processor is mounted to a processor carrier and thermally coupled to a heatsink. The processor carrier is a frame structured to retain the processor and facilitate coupling of the processor and the heatsink. The processor may be coupled to a processor socket that is communicatively coupled to a circuit board. The processor socket (e.g., slot) is a specific component of the circuit board that provides a communicative connection between the processor and other components of the circuit board. For example, the processor socket may be manufactured with a series of pins, contact pads, balls, and/or other contact points for transfer of power and data between the processor and the circuit board.

The processor is typically coupled to the processor socket via a loading mechanism to ensure the electrical connections between the processor and the processor socket are established and stable. For example, the loading mechanism can be implemented by a metal plate (e.g., a retention plate, bolster plate, etc.) that surrounds the processor socket and is bolted to the circuit board. The heatsink, which is placed above the process to remove heat from the processor (e.g., generated by the processor during operation), can also the apply the load to the processor via the loading mechanism. For example, by placing the heatsink adjacent the processor and securing the heatsink to the metal plate, a heat transfer surface (e.g., a bottom surface) of the heatsink can apply the load to the IHS of the processor, securing the processor to the processor socket.

Typically, a TIM is applied to the IHS prior to mounting the heatsink to the processor to enhance heat conduction from the processor to the heatsink. The TIM can be, for example, a thermally conductive adhesive tape, thermal paste, putty, gel, and/or grease, a phase-change material, a potting compound and/or liquid adhesive, another material capable of enhancing heat transfer, and/or a combination thereof. A TIM disposed between the IHS and a heat transfer surface of the heatsink and/or another heat dissipating device is referred to as a TIM-2 bond layer. Under pressure of the load, the layer of TIM-2 develops adhesive bonds between the processor and heatsink, joining the IHS to the heatsink. To replace, repair, or otherwise service the processor, the TIM-2 bond layer may need to be broken to separate the processor from the heatsink. However, this TIM-2 bond layer can be difficult to break, requiring a relatively large force (e.g., compared to a force needed to overcome a snap tab coupling the processor carrier to the heatsink) for separation of processor and the heatsink.

A common method to break the TIM-2 bond layer to separate the processor and heatsink is to use a flathead screwdriver. A service provider (e.g., a human and/or machine) can use the flathead screwdriver as a wedge by placing the tip of the flathead screwdriver between the IHS and the heatsink and prying the processor from the heatsink. For example, the screwdriver can be repeatedly twisted (e.g., rotated) until the TIM-2 bond layer breaks, enabling the processor and the heatsink to separate. In some examples, the service provider may need to physically shake the heatsink/processor combination to break the adhesion from the TIM-2 bond layer.

The screwdriver method is beneficial in that it does not require space utilization in the PH assembly. However, rotating the potentially sharp screwdriver next to the processor to break the TIM-2 bond often results in damage to the processor. For example, the rotation of the screwdriver adjacent the processor can scrape material from the IHS, another portion of the processor, and/or the heatsink. In some examples, the screwdriver may be improperly inserted between the processor and heatsink, resulting in a gouging to the processor substrate. In some such examples, the gouge may render the processor inoperable and/or otherwise nonfunctional. Shaking the heatsink off of the processor also risks damage to the more delicate processor and/or adjacent components such as memory. Considering that the processor is a particularly fragile and often expensive hardware component, a different method to break the TIM-2 bond layer to separate the processor and the heatsink is desired.

Another method to break the TIM-2 bond layer is to store a known release lever on the processor carrier adjacent the processor. The release lever is a crowbar type mechanism formed of a wire or other material that attaches to a processor carrier and includes a blade that rests adjacent the processor. The release lever can be grasped by a hand or other gripping tool and pivoted about a connection point (on the processor carrier) to break the TIM-2 bond layer. That is, the release lever includes the blade and the lever, each of which extend in different directions from a center of rotation. Thus, the release lever consumes a relatively large amount of space on the processor carrier. As technology enhances, there has been a trend for processors to grow in size and include larger amounts of components. For example, high-end processors, such as server processers, include a relatively large number of components on the processor and/or the processor carrier (e.g., as compared to a low-end processor for some personal computing devices), leaving little to no room to place such a release lever. In some such processors, there is no longer space to include such a release lever. Integrating the release lever on such processors would likely result in limitations of the processor's performance by consuming space that could be utilized for processing components. Absent a new method to break the TIM-2 bond layer, service providers of such processors will continually damage the processor by using a screwdriver to break the TIM-2 bond layer.

Examples disclosed herein enable a new method to break the TIM-2 bond layer to separate the processor and the heatsink that limits or otherwise eliminates possible damage to the processor during a de-bonding process while occupying a limited amount of space in a PH assembly. Example disclosed herein enable manufacture of an example separator device(s) (e.g., component separator, de-bonder device, etc.) having a restricted size that can be integrated into an example processor carrier and/or another component adjacent an example processor in an example processor assembly. Example separator devices disclosed herein include an example head, an example blade portion, and an example shaft positioned therebetween. In some examples, the shaft of may be positioned within an example clip (e.g., clasp, sleeve, etc.) of the example processor carrier in which the processor may reside. In some examples, the shaft may define an axis of rotation of the example separator device. The shaft may be associated with a radius measured relative to the axis of rotation. In some examples, the radius of the shaft may corresponds to a radius of an example clip in which the shaft is to reside.

The head can include an example drive (e.g., surfaces defining a recess and/or protrusion), which is structured to receive or otherwise interface (e.g., connect) with a rotation tool. As disclosed herein, a rotation tool refers to a device (e.g., a tool) having a driver (e.g., tip, blade, socket, etc.) at an end of a shaft. For example, the rotation tool may be a screwdriver, a wrench, drill, etc. In some examples, the drive of the head includes surfaces that define a shaped cavity (e.g., recess, trench, etc.) that is to connect with a rotation tool having a correspondingly shaped tip. In other examples, the drive of the head can include surfaces that define a shaped protuberance (e.g., protrusion, etc.) that is to connect with a rotation tool having a correspondingly shaped socket (e.g., recess).

The example blade portion of example separator devices disclosed herein include an example blade (e.g., paddle, wedge, etc.) having an example tip. The blade may be substantially perpendicular to an example diameter of the shaft and/or the head. However, the blade may be oriented at another angle relative to the diameter of the shaft and/or head. When assembled, the tip of the blade may be positioned between an example edge of the processor and an example heat transfer surface of an example heatsink. In example separator devices disclosed herein, the shaft may be associated with a diameter and/or other dimension that is smaller than a dimension of the head and the blade portion to hold the separator device in place and to prevent the separator device from moving (e.g., sliding within or out of the clip of the processor assembly).

To break the TIM-2 bond layer and separate the processor and the heatsink, a service provider (e.g., a user, a human, a machine, etc.) can interface a driver of a rotation tool with the drive of the example separator device(s) disclosed herein and apply a rotational force (e.g., rotate, twist). The rotational force of the screwdriver is applied to the example separator device, causing the separator device to rotate. The resulting rotation of the separator device causes the blade to apply a force on the edge of the processor and/or the heatsink, which can be held, adjusted, and/or re-applied until the TIM-2 bond breaks, enabling separation of the processor and the heatsink. Example separator devices disclosed herein preclude the rotation tool from contacting the processor during the de-bonding process to prevent damage to the processor and/or adjacent components.

Example separator device(s) disclosed herein reduce or otherwise minimize space consumption in the PH assembly as compared to the release lever. In some examples, disclosed separator devices can save a significant amount of space within a PH assembly. In some examples, the separator device is approximately 84% shorter than the release lever. In some examples, the separator device enables better (e.g., faster, etc.) processor performance by limiting size restrictions of the separator device. For example, reducing the size of the separator device provides more space for larger and/or an increasing amount of components on the processor and/or the PH assembly.

Certain example separator devices enable increased profits for a processor manufacturer. For example, the manufacture may be able to validate (e.g., confirm, verify) which component(s) and/or tool(s) can contact the processor while the processor is positioned with the processor socket. As such, the manufacturer can limit damage to processors, saving the manufacturer money by limiting a number of returned units. Further, the smaller size of the separator device (e.g., as compared to the release lever) results in better utilization of space on the processor carrier, allowing for more processor and/or circuit board components and driving higher performance of a corresponding system.

Examples disclosed herein may improve user experience when removing the processor from a PH assembly. For example, example separator devices disclosed herein may enable ease of use and/or reduced effort needed to break a TIM-2 bond layer to separate hardware components.

As disclosed herein, a processor socket assembly includes bolster plate that is to surround a processor socket that is to connect with the processor. The processor socket may be directly coupled a circuit board. The bolster plate may include mounting studs for coupling with the heatsink. In some examples, the PH assembly is assembled before being mounted to the processor socket assembly. In some examples, the PH assembly is removed from the processor socket assembly prior to removal of the processor from the PH assembly (e.g., for maintenance, replacement, etc.).

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc.

The use of liquids to cool electronic components is being explored for its benefits over more traditional air cooling systems, as there are increasing needs to address thermal management risks resulting from increased thermal design power in high performance systems (e.g., CPU and/or GPU servers in data centers, cloud computing, edge computing, and the like). More particularly, relative to air, liquid has inherent advantages of higher specific heat (when no boiling is involved) and higher latent heat of vaporization (when boiling is involved). In some instances, liquid can be used to indirectly cool electronic components by cooling a cold plate that is thermally coupled to the electronic components. An alternative approach is to directly immerse electronic components in the cooling liquid. In direct immersion cooling, the liquid can be in direct contact with the electronic components to directly draw away heat from the electronic components. To enable the cooling liquid to be in direct contact with electronic components, the cooling liquid is electrically insulative (e.g., a dielectric liquid). Direct immersion cooling can involve at least one of single-phase immersion cooling or two-phase immersion cooling.

As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase immersion cooling or two-phase immersion cooling.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other computing devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose processors), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first processor circuitry assigned to one managed node and second processor circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (processors, storage, accelerators, etc.) typically have different refresh rates, greater resource utilization and reduced total cost of ownership may be achieved. For example, a data center operator can upgrade the processor circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
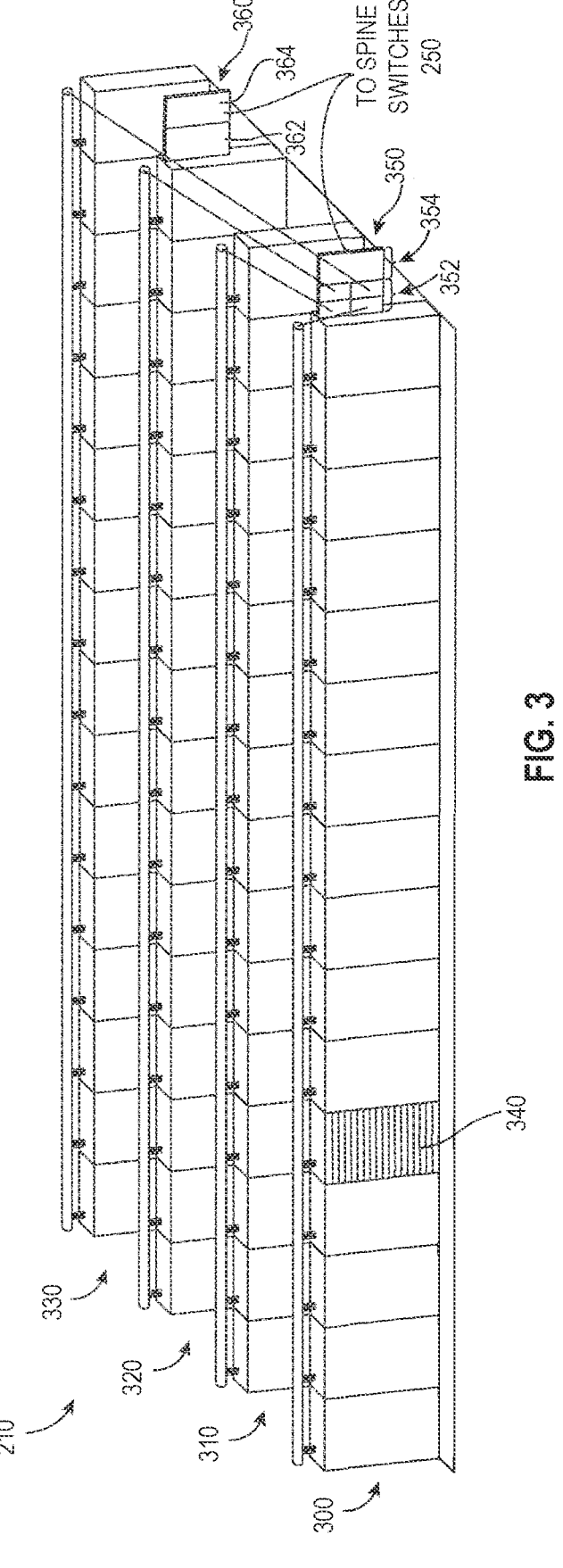
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
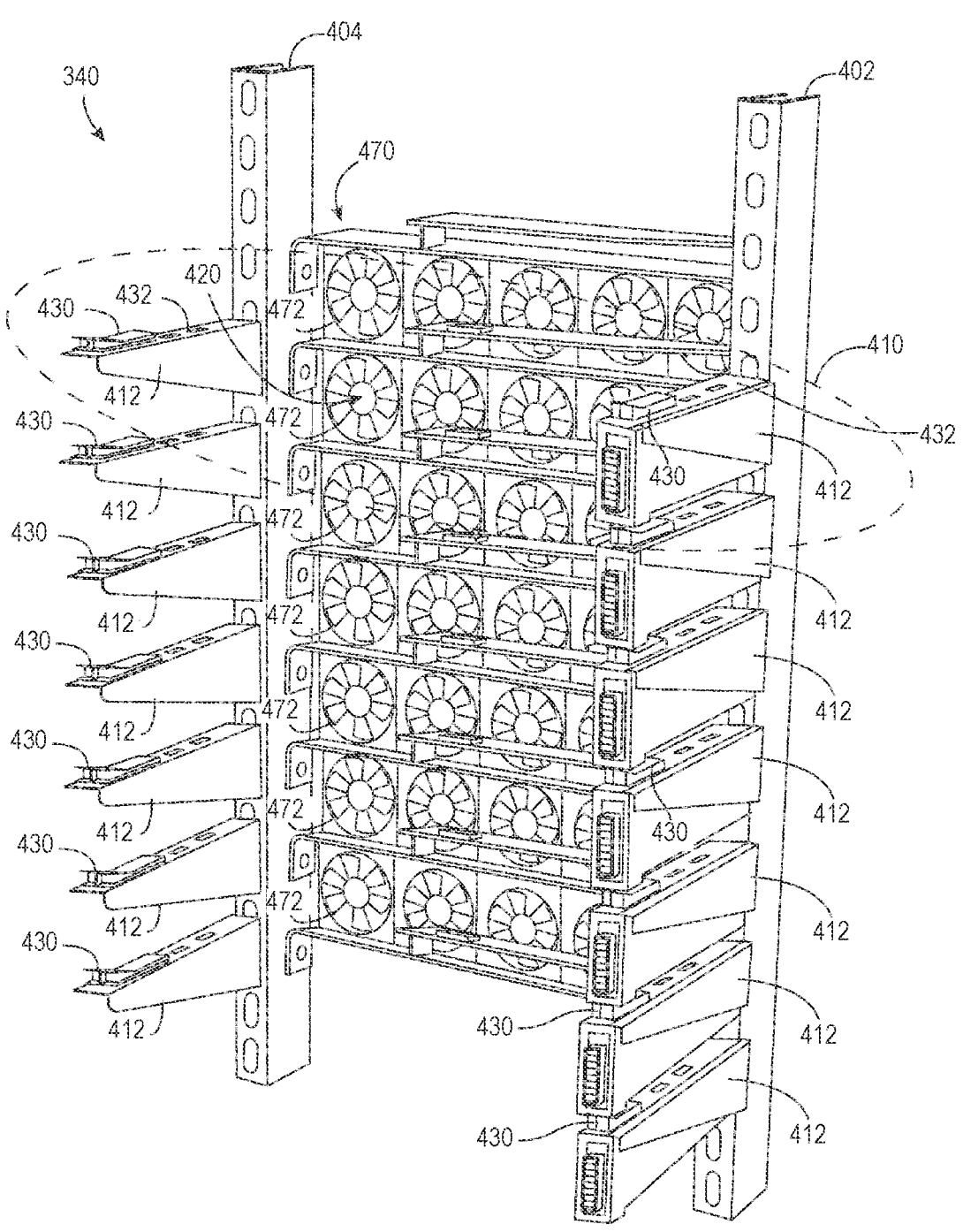
FIG. 4 is a perspective view of at least one example of a rack that may be included in the pod of FIG. 3.
Figure 5:
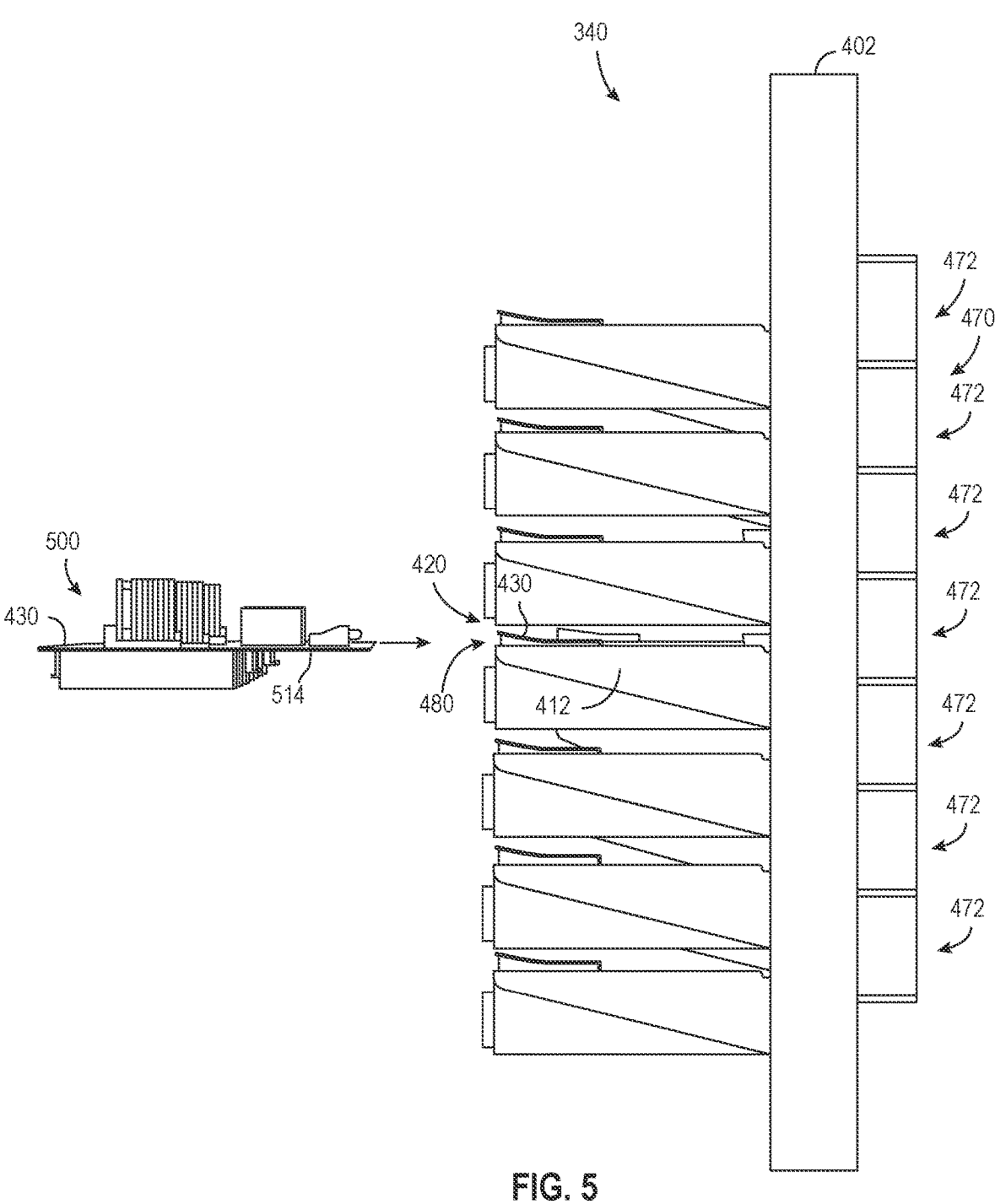
FIG. 5 is a side elevation view of the rack of FIG. 4.
Figure 6:
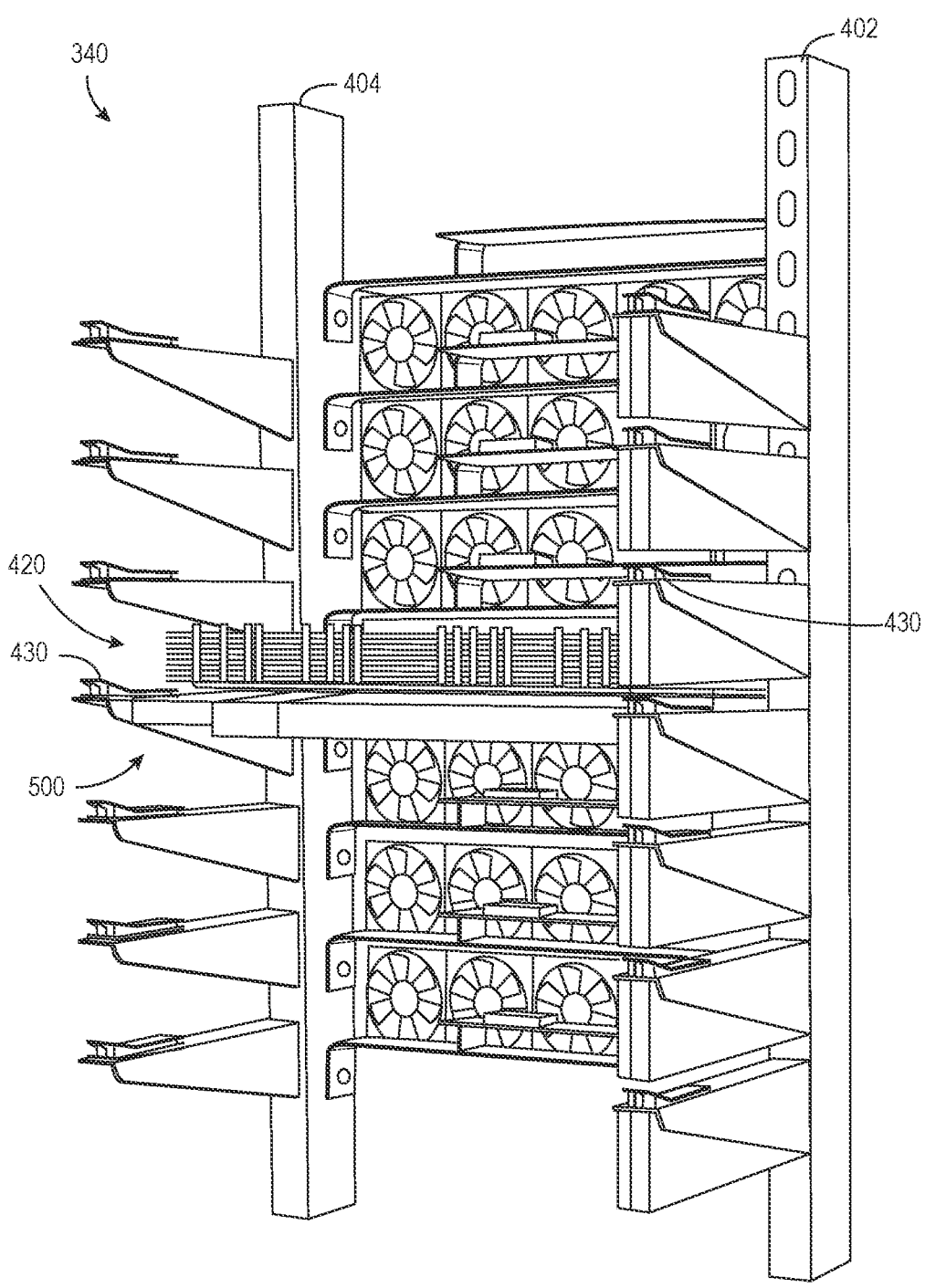
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., processors, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one other and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1U"). That is, the vertical distance between pairs 410 of elongated support arms 412 may be less than a standard rack unit "1U." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1U." In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
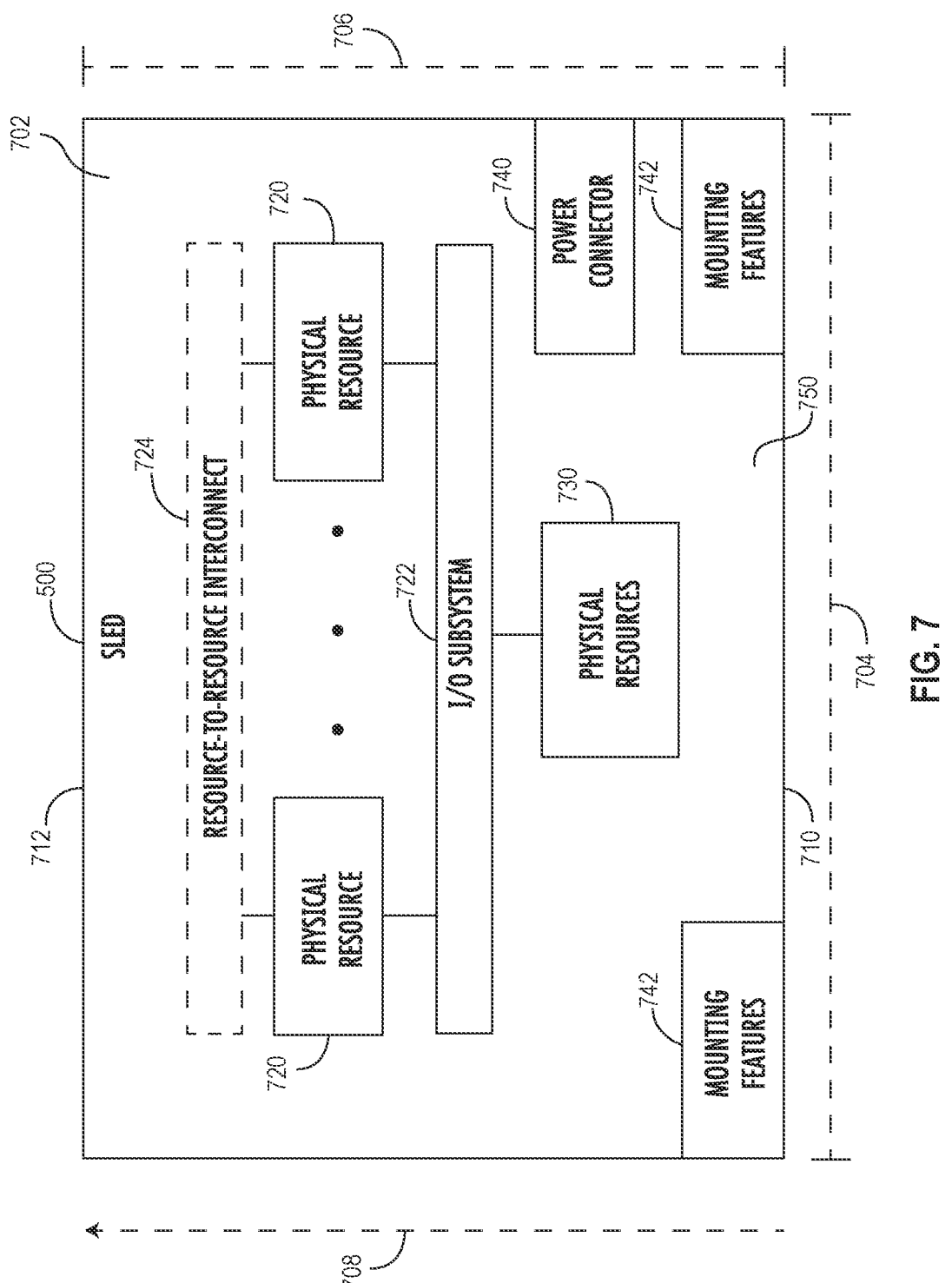
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a give sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase immersion cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of processor, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processors in examples in which the sled 500 is implemented as a compute sled, as accelerator co-processors or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of processor circuitry 920 (see FIG. 9), and power is routed from the voltage regulators to the processor circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 700 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
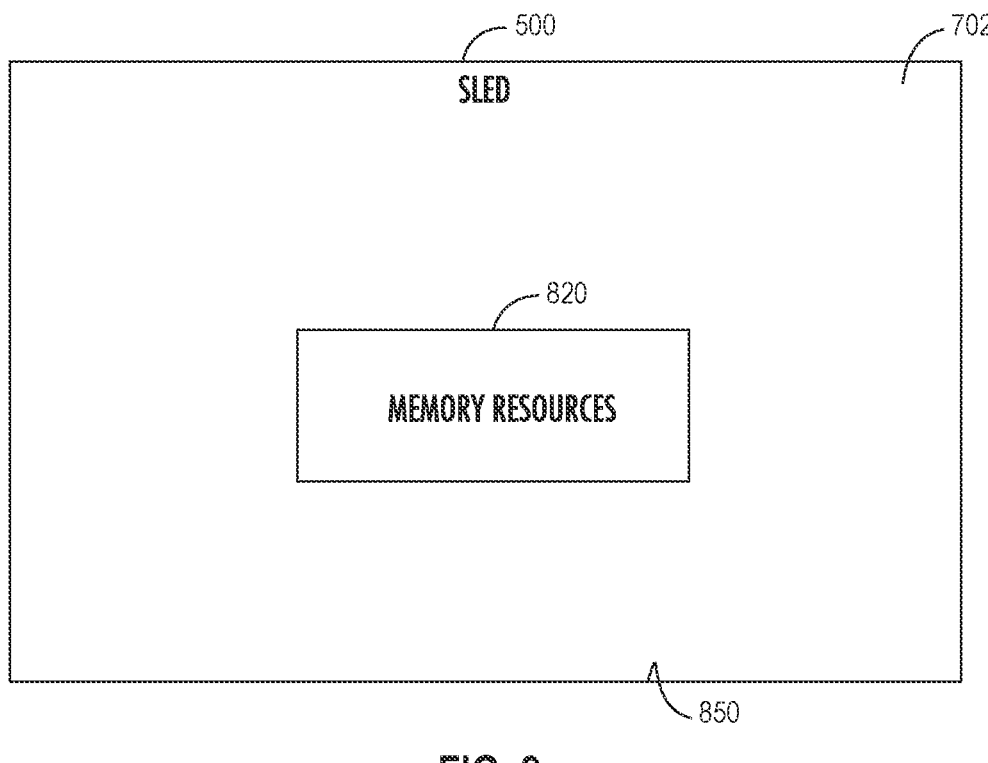
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferro-electric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
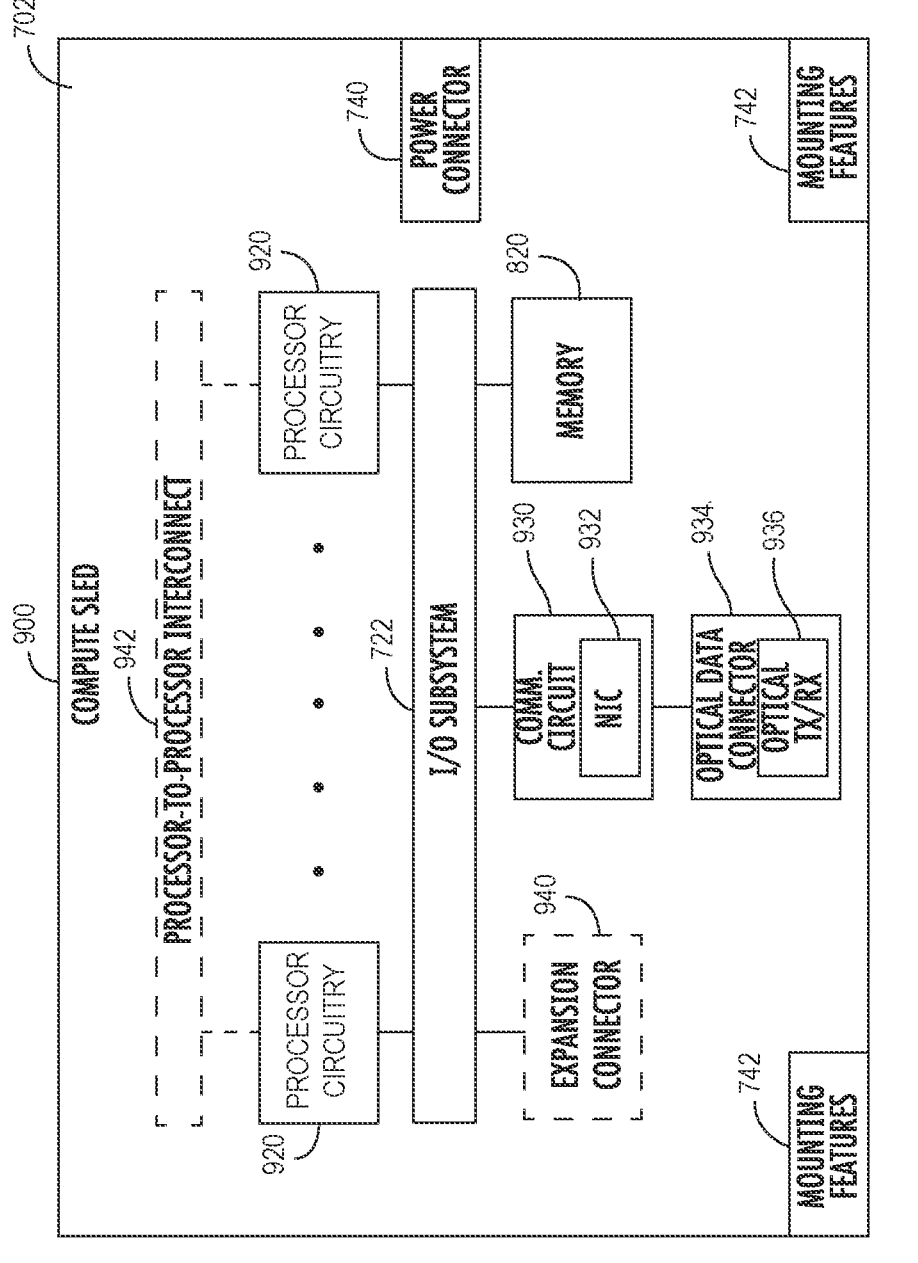
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include processor circuitry 920. Although only two blocks of processor circuitry 920 are shown in FIG. 9, it should be appreciated that the compute sled 900 may include additional processor circuits 920 in other examples. Illustratively, the processor circuitry 920 corresponds to high-performance processors 920 and may be configured to operate at a relatively high power rating. Although the high-performance processor circuitry 920 generates additional heat operating at power ratings greater than typical processors (which operate at around 155-230 W), the enhanced thermal cooling characteristics of the chassis-less circuit board substrate 702 discussed above facilitate the higher power operation. For example, in the illustrative example, the processor circuitry 920 is configured to operate at a power rating of at least 250 W. In some examples, the processor circuitry 920 may be configured to operate at a power rating of at least 350 W.

In some examples, the compute sled 900 may also include a processor-to-processor interconnect 942. Similar to the resource-to-resource interconnect 724 of the sled 500 discussed above, the processor-to-processor interconnect 942 may be implemented as any type of communication interconnect capable of facilitating processor-to-processor interconnect 942 communications. In the illustrative example, the processor-to-processor interconnect 942 is implemented as a high-speed point-to-point interconnect (e.g., faster than the I/O subsystem 722). For example, the processor-to-processor interconnect 942 may be implemented as a Quick-Path Interconnect (QPI), an UltraPath Interconnect (UPI), or other high-speed point-to-point interconnect dedicated to processor-to-processor communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processors, or included on a multichip package that also contains one or more processors. In some examples, the NIC 932 may include a local processor (not shown) and/or a local memory (not shown) that are both local to the NIC 932. In such examples, the local processor of the NIC 932 may be capable of performing one or more of the functions of the processor circuitry 920. Additionally or alternatively, in such examples, the local memory of the NIC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the processor circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 10:
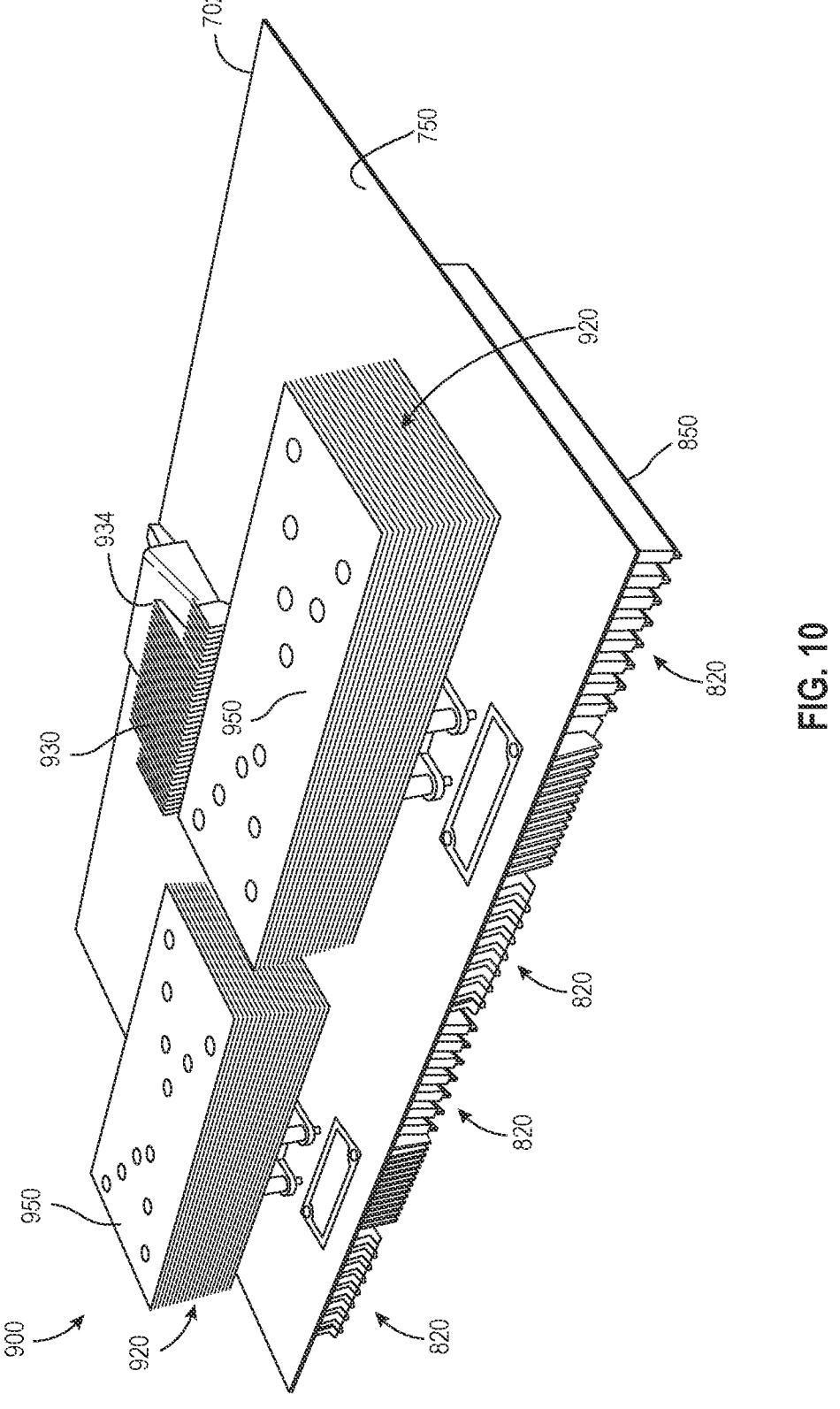
FIG. 10 is a top perspective view of at least one example of the compute sled of FIG. 9.

Referring now to FIG. 10, an illustrative example of the compute sled 900 is shown. As shown, the processor circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor socket), holders, or brackets. In some cases, some of the electrical components may be directly mounted to the chassis-less circuit board substrate 702 via soldering or similar techniques.

As discussed above, the separate processor circuitry 920 and the communication circuit 930 are mounted to the top side 750 of the chassis-less circuit board substrate 702 such that no two heat-producing, electrical components shadow each other. In the illustrative example, the processor circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the processor circuitry 920 located on the top side 750 via the I/O subsystem 722. Because the chassis-less circuit board substrate 702 is implemented as a double-sided circuit board, the memory devices 820 and the processor circuitry 920 may be communicatively coupled by one or more vias, connectors, or other mechanisms extending through the chassis-less circuit board substrate 702. Different processor circuitry 920 (e.g., different processors) may be communicatively coupled to a different set of one or more memory devices 820 in some examples. Alternatively, in other examples, different processor circuitry 920 (e.g., different processors) may be communicatively coupled to the same ones of the memory devices 820. In some examples, the memory devices 820 may be mounted to one or more memory mezzanines on the bottom side of the chassis-less circuit board substrate 702 and may interconnect with a corresponding processor circuitry 920 through a ball-grid array.

Different processor circuitry 920 (e.g., different processors) include and/or is associated with corresponding heat-sinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the processor heatsinks 950 include cooling fans attached thereto. That is, the heatsinks 950 may be fan-less heatsinks. In some examples, the heatsinks 950 mounted atop the processor circuitry 920 may overlap with the heatsink attached to the communication circuit 930 in the direction of the airflow path 708 due to their increased size, as illustratively suggested by FIG. 10.

Figure 11:
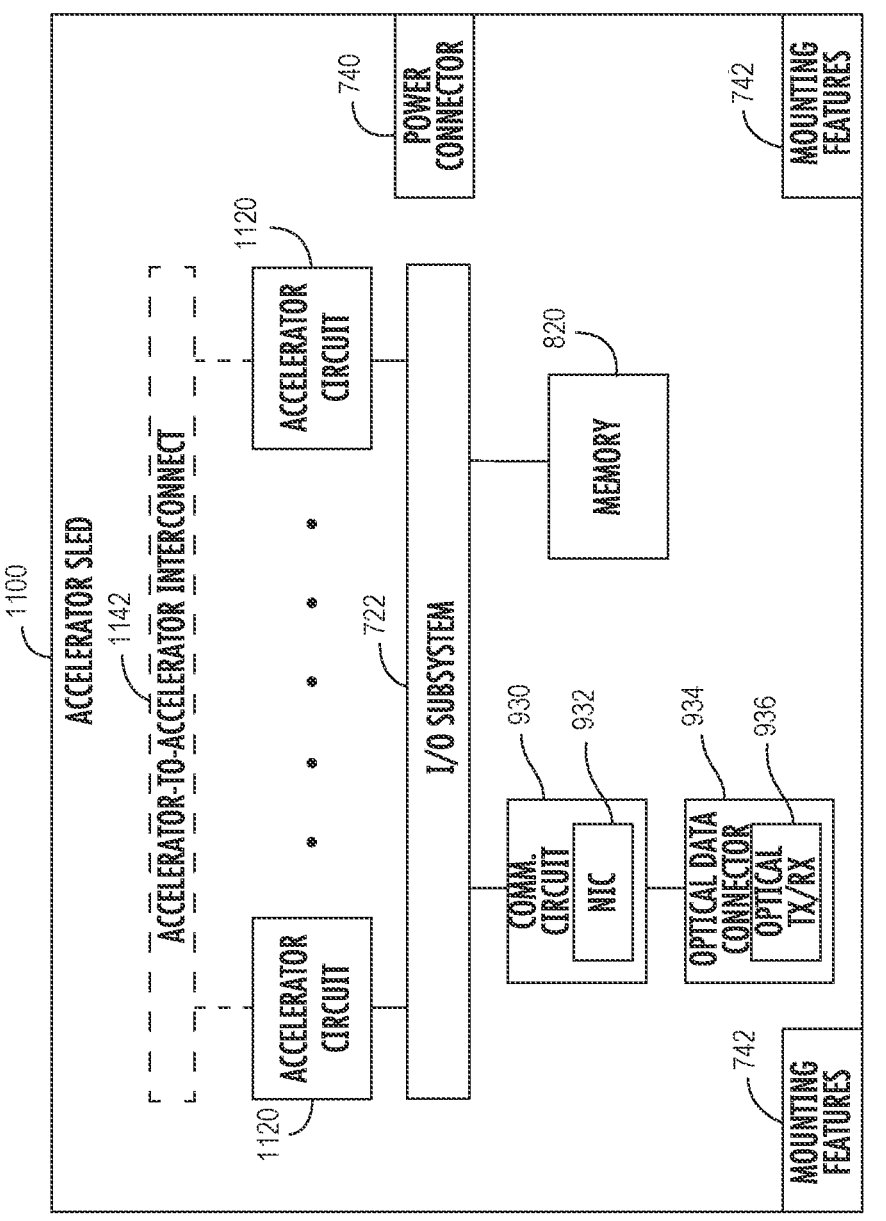
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
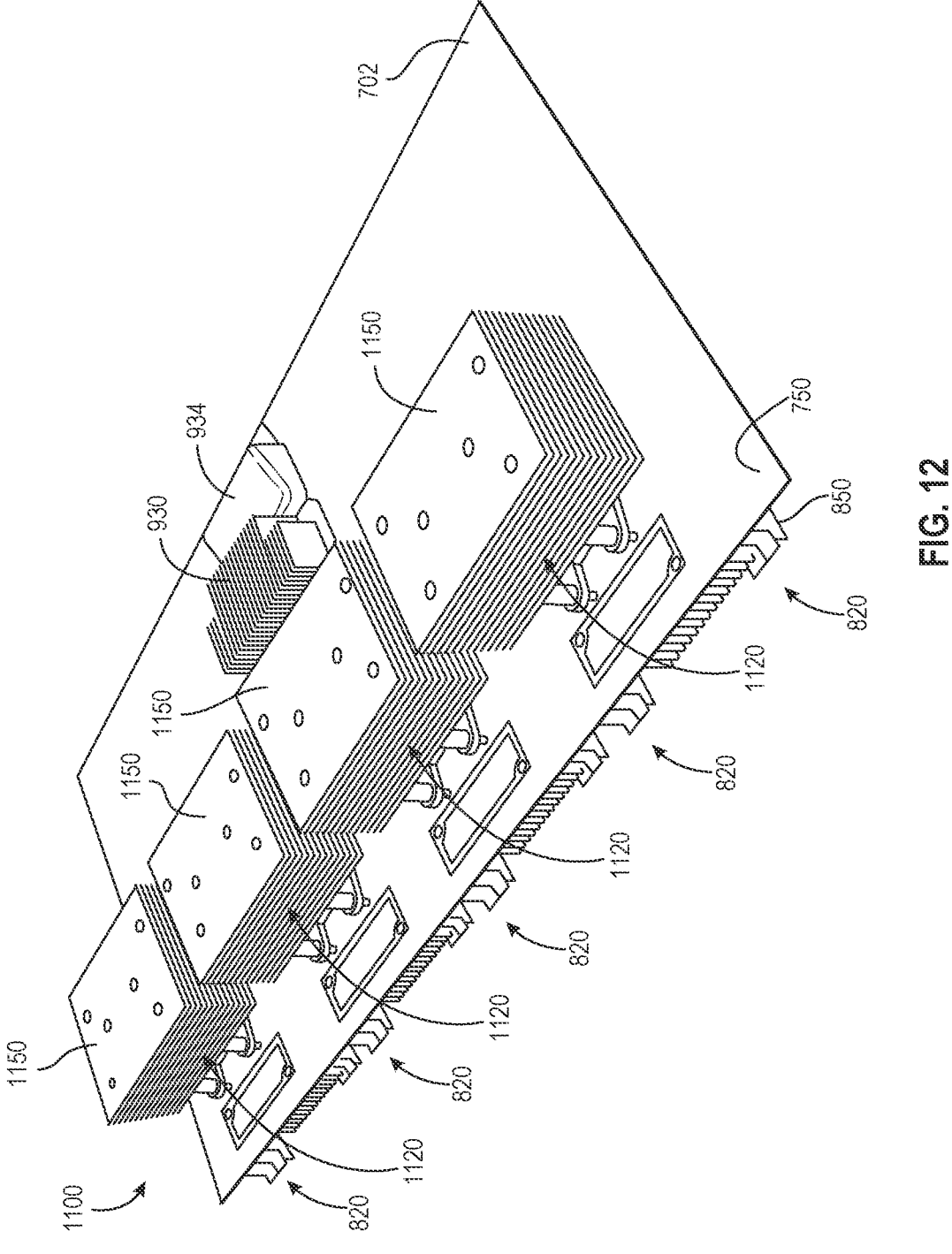
FIG. 12 is a top perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor, co-processor, compute circuit, or other device capable of performing compute or processing operations. For example, the accelerator circuits 1120 may be implemented as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some examples, the accelerator sled 1100 may also include an accelerator-to-accelerator interconnect 1142. Similar to the resource-to-resource interconnect 724 of the sled 700 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to processor-to-processor communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 700. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
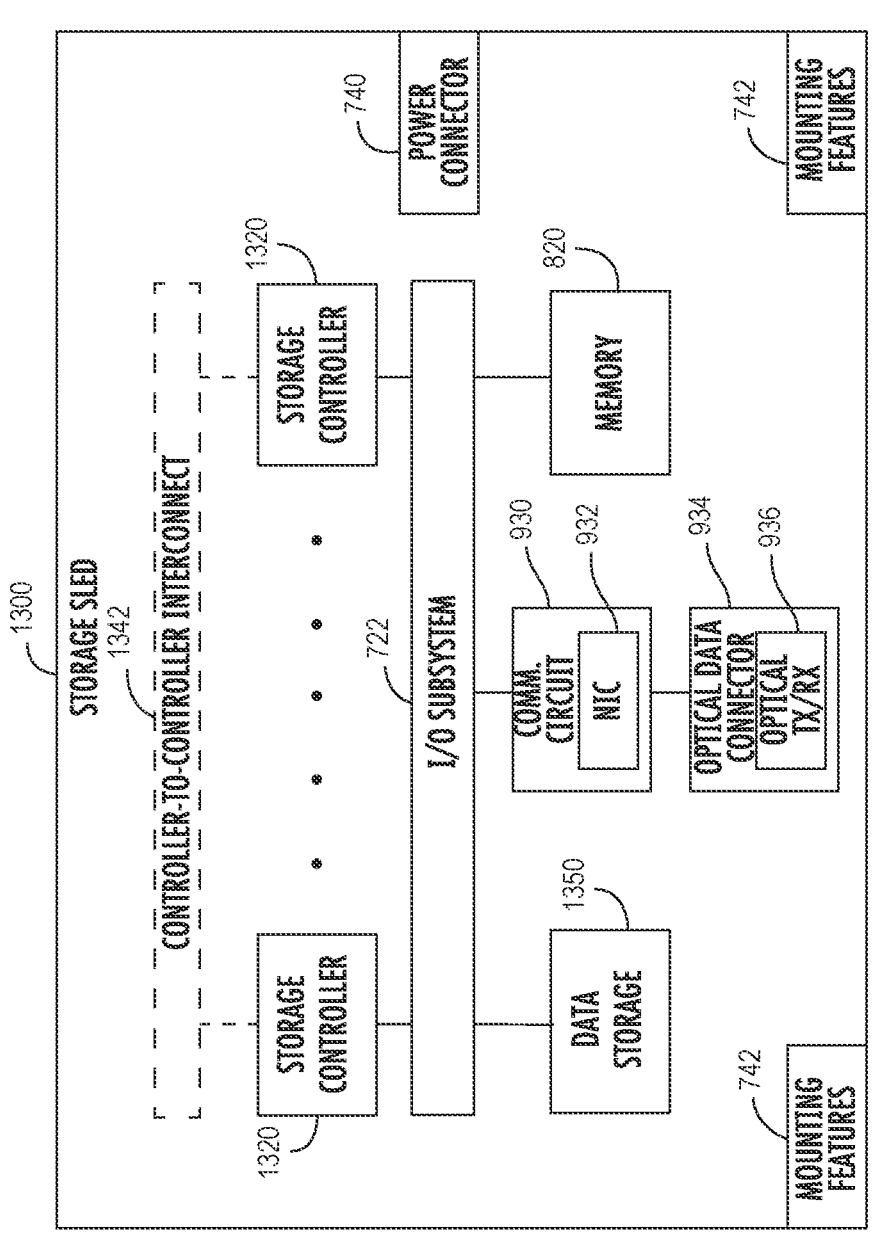
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of processor, controller, or control circuit capable of controlling the storage and retrieval of data into the data storage 1350 based on requests received via the communication circuit 930. In the illustrative example, the storage controllers 1320 are implemented as relatively low-power processors or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to processor-to-processor communications.

Figure 14:
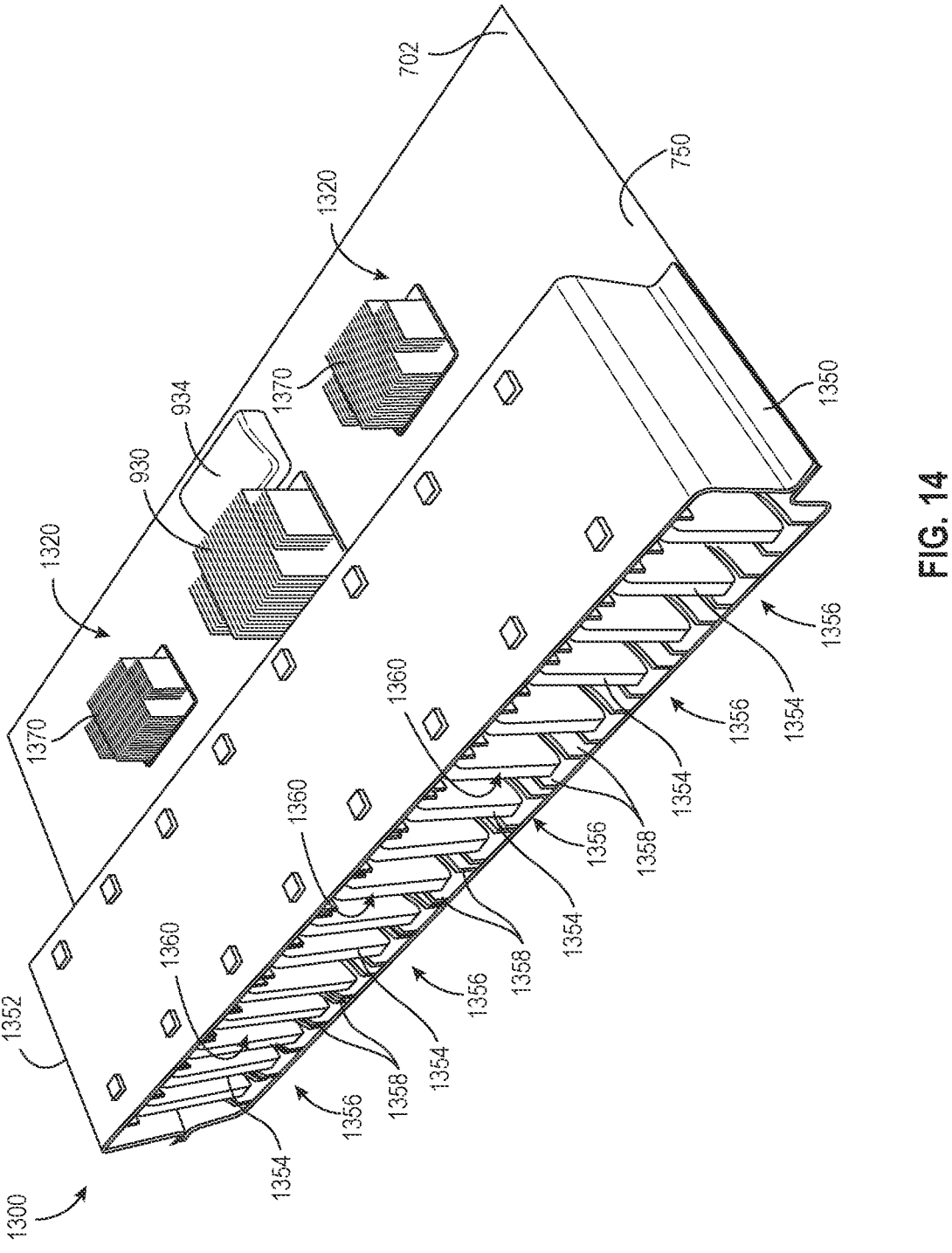
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening 1360 of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 304. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
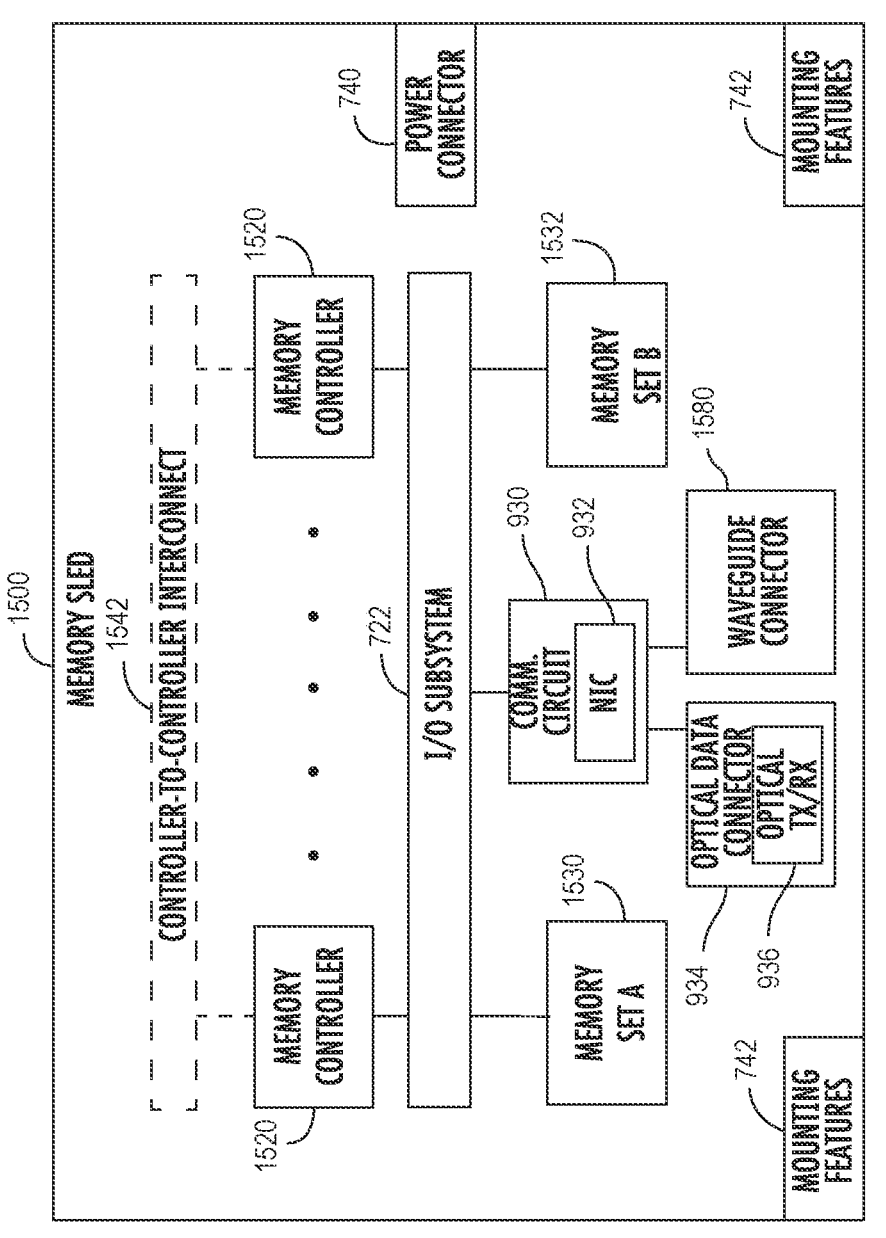
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of processor, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to processor-to-processor communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
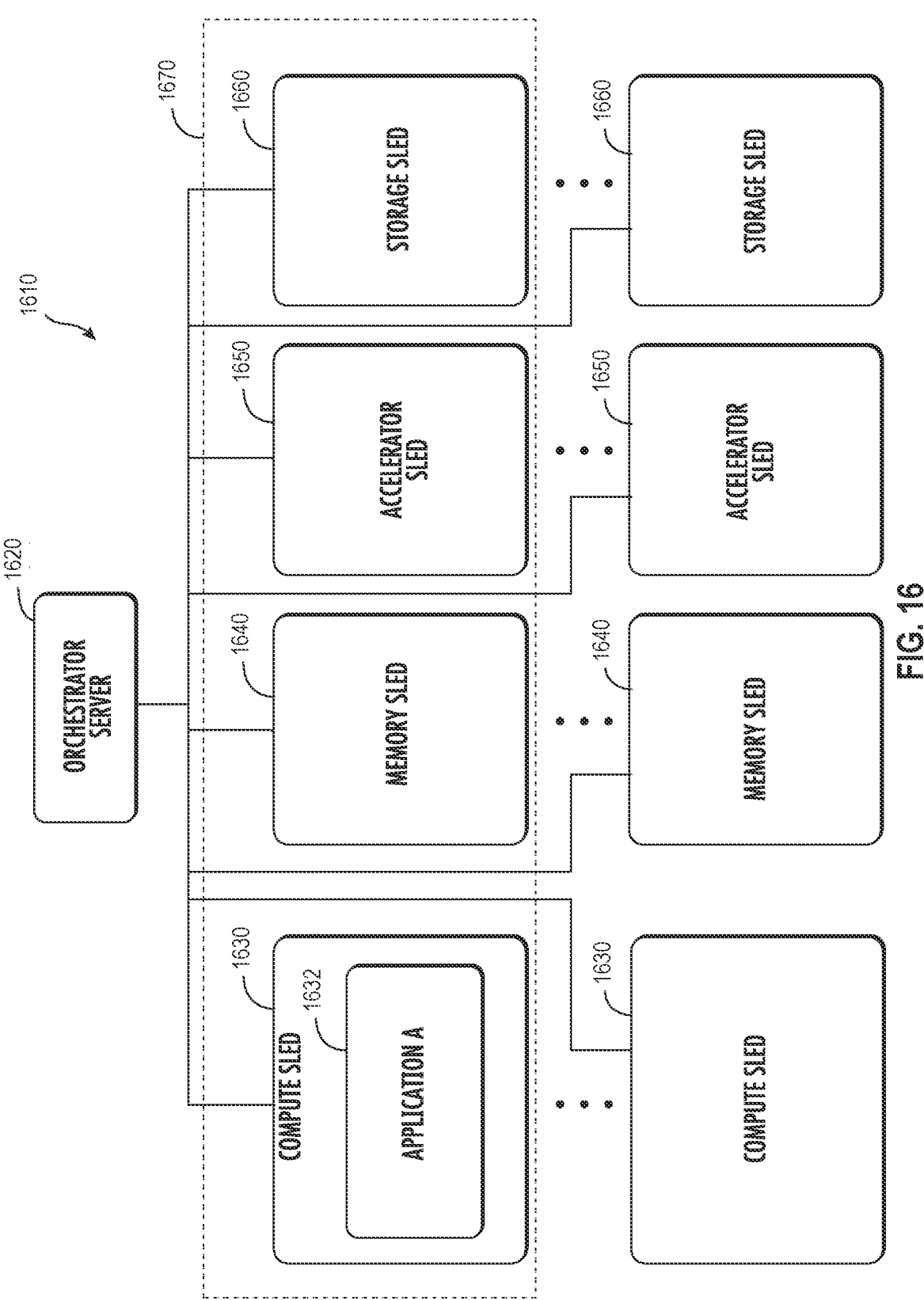
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., processor circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to memory sled 1500), accelerator sleds 1650 (e.g., similar to the memory sled 1000), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as processor circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17:
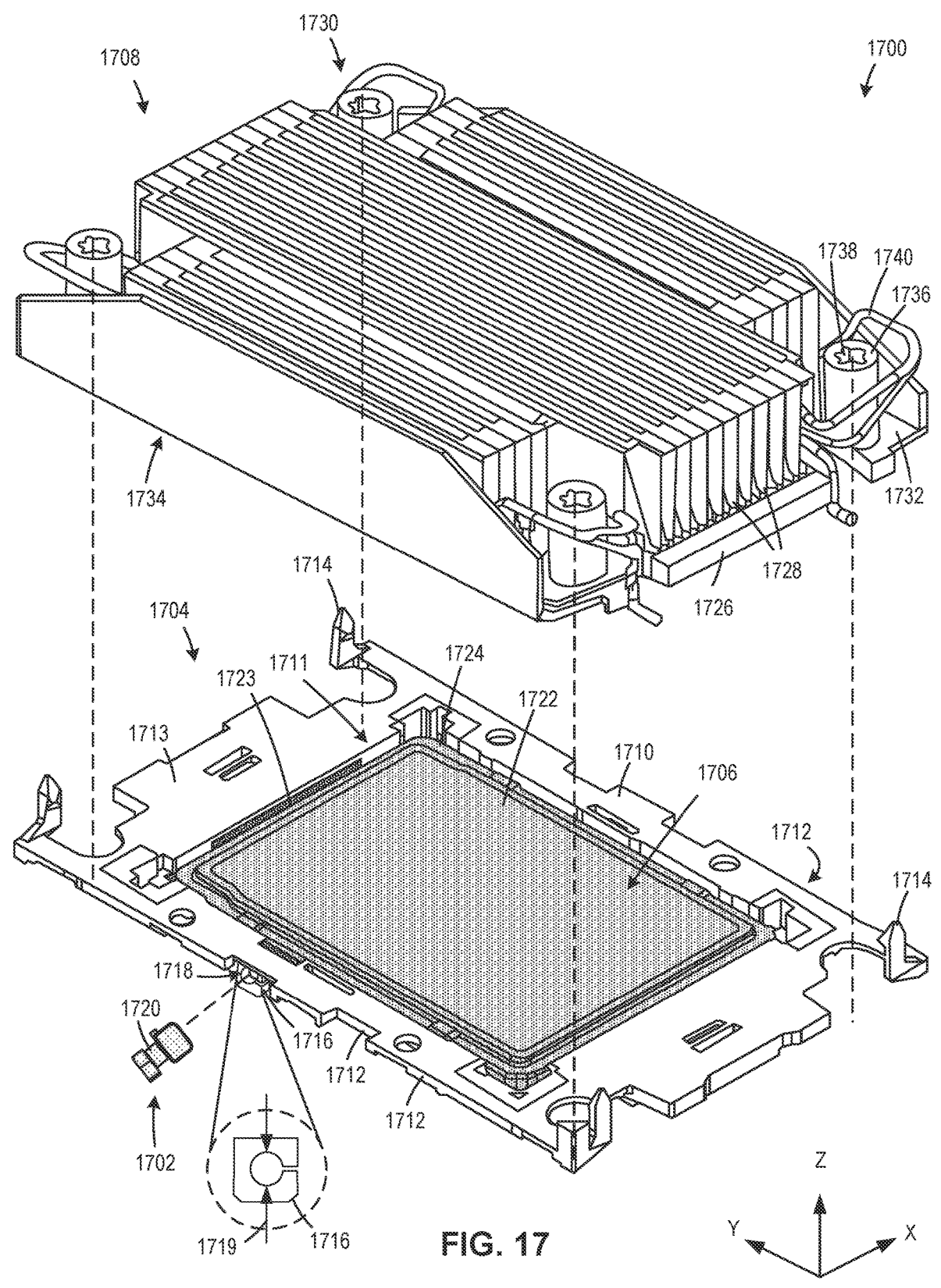
FIG. 17 is an exploded isometric view of an example processor heatsink (PH) assembly including an example separator device constructed in accordance with teachings of this disclosure.

FIG. 17 is an exploded isometric view of an example processor heatsink (PH) assembly 1700 including an example separator device 1702 constructed in accordance with teachings of this disclosure. In some examples, the PH assembly 1700 may be part of a server, in which the PH assembly 1700 may mounted to a circuit board (e.g., a motherboard, a printed circuit board, etc.), such as a chassis-less circuit board that resides within a data center 102, 106, 116, a building 110 (e.g., for purposes of business and/or industry), etc. In some examples, the PH assembly 1700 may be mounted to circuit board of a personal computer (PC) device, such as a laptop, a desktop, an electronic tablet, a hybrid or convertible PC, etc. The example PH assembly 1700 of FIG. 17 includes the example separator device 1702 (e.g., component separator, disjoiner device, detachment device, etc.), an example processor carrier 1704, an example processor 1706 (e.g., a semiconductor component), and an example heatsink 1708. However, the PH assembly can include additional or alternative components in other examples.

The processor carrier 1704 is structured to secure the processor 1706 in place (e.g., to prevent damage to the processor 1706 and/or a processor socket onto which the processor 1706 is mounted). The processor carrier 1704 includes or is otherwise defined by an example frame 1710, which defines an example aperture (e.g., opening, gap, hole, etc.) 1711 for receiving the processor 1706. In some examples, the processor carrier 1704 implements a means for carrying the processor 1706 and/or another hardware component. In some examples, the frame 1710 implements means for carrying the processor 1706 and/or another hardware component. In some examples, the frame 1710 includes an interior surface (e.g., inner edge, etc.) that defines the aperture 1711. In some examples, the frame 1710 includes an example exterior surface (e.g., outer edge, perimeter, border, etc.) 1712 that defines an outer perimeter of the processor carrier 1704. While the frame 1710 is typically formed of using a plastic material, other materials (e.g., a metal(s), a ceramic(s), etc., and/or a combination thereof) can be used in additional or alternative examples.

In some examples, the processor carrier 1704 may be structured to enable attachment the processor 1706 and the heatsink 1708, creating a combined module for installation onto a processor socket assembly (not illustrated). The processor carrier 1704 of FIG. 17, for example, may be coupled (e.g., mounted) to the heatsink 1708 while retaining the processor 1706 (e.g., while the PH assembly 1700 is in assembly). The frame 1710 of FIG. 17 includes an example heatsink interface surface 1713, which is a surface of the frame 1710 that is to interface with the heatsink 1708 in assembly. In some examples, the processor carrier 1704 includes one or more example heatsink mounting tab(s)

1714 extending from the frame 1710 (e.g., in a Z-direction), which are structured to engage with the heatsink 1708. In some examples, the heatsink mounting tabs 1714 extend orthogonally relative to the frame 1710. The processor carrier 1704 of FIG. 17 includes a heatsink mounting tab 1714 in each corner of the processor carrier 1704. However, it is understood that the processor carrier 1704 can include a different number of heatsink mountings tabs 1714 and/or include the heatsink mounting tabs 1714 in different locations.

The frame 1710 of the processor carrier 1704 includes an example clip (e.g., clasp, sleeve, etc.) 1716 to retain or otherwise secure at least a portion of the example separator device 1702. In some examples, the clip 1716 is defined by a deformable split wall generating an example passageway 1718 for the separator device 1702. In some examples, the clip 1716 is defined by a wall that is coupled to the frame 1710 via a hinge type mechanism (not illustrated). While the processor carrier 1704 of FIG. 17 includes one clip 1716, the processor carrier 1704 can include multiple clips 1716 in additional or alternative examples. In some examples, the clip(s) 1716 can be positioned at different locations on the processor carrier 1704. In some examples, one or more of the clip(s) 1716 are located adjacent one or more of the heatsink mounting tab(s) 1714.

In some examples, the passageway 1718 is cylindrical, and has an axis that coincides with an axis of rotation of the separator device 1702. FIG. 17 includes an enlarged view of the clip 1716, which illustrates an example clip diameter 1719 defining a diameter of an inner surface (e.g., the passageway 1718) of the clip 1716. In some examples, separator device 1702 attaches to frame 1710 by insertion of an example shaft 1720 of the separator device 1702 into the passageway 1718 of the clip 1716, indicated by the dashed line. However, it is understood that examples are not limited to the afore-mentioned description, and that other suitable structures are possible for attachment of shaft 1720 to the frame 1710. In some examples, the separator device 1702 is to rotate in a plane that is substantially parallel to an X-Y plane when actuated.

The processor 1706 (e.g., integrated processor package, processor package, etc.) of FIG. 17 can be any type of processor, such as a microprocessor, a central processing unit (CPU), an accelerator, etc. The processor 1706 of FIG. 17 includes an example integrated heat spreader (IHS) 1722, which is a metal plate that acts as a lid for an example processor substrate 1723 holding a processor die (not illustrated herein). The IHS 1722 of FIG. 17 includes an example edge(s) (e.g., IHS step(s)) 1724. In some examples, the processor carrier 1704 may include one or more snap tabs (e.g., snap tabs 2302 of FIG. 23) that engage with a portion(s) of the edges 1724 when the processor 1706 is mounted in the processor carrier 1704. The snap tabs 2302 retain the processor 1706 within the processor carrier 1704. In some examples, one or more of the clip(s) 1716 may be positioned adjacent one or more of the snap tabs 2302.

The example heatsink 1708 includes an example base 1726, example fins (e.g., heat transfer fins) 1728, and example fastener(s) (e.g., fastener assemblies) 1730. The fins 1728 may be integrated with and/or otherwise coupled to an example first (e.g., top, fin, etc.)) side 1732 the base 1726. The base 1726 of FIG. 17 includes an example second (e.g., bottom, heat transfer) side 1734, which is a side opposite the fin side 1732 of the base 1726. In some examples, the heat transfer side 1734 of the base 1726 is also a heat transfer side 1734 of the heatsink 1708.

In the illustrated example of FIG. 17, the fasteners 1730 are positioned at each corner of the base 1726. In some examples, however, the heatsink 1708 can include more or less fasteners 1730 and/or position the fastener(s) 1730 in additional or alternative locations. In some examples, the fasteners 1730 are structured to couple the heatsink 1708 to the processor socket (not illustrated). In some examples, the fastener(s) 1730 can be used to apply a load to the processor 1706. As noted above, the heatsink 1708 and the processor carrier 1704 may be structured to enable integration of the processor carrier 1704, processor 1706, and the heatsink 1708 together, creating a combined module (e.g., for installation onto the processor socket assembly). For example, the processor 1706 can clip into the processor carrier 1704 via the snap tabs 2302 of the processor carrier 1704 while the processor carrier 1704 can attach to the heatsink 1708 via the heatsink mounting tabs 1714 that snap onto or otherwise engage with the heatsink 1708.

While not illustrated in examples disclosed herein, the PH assembly 1700 may be mounted to the processor socket assembly that includes a bolster plate and a processor socket. The bolster plate, which is a metal frame that surrounds and/or holds a processor socket, may be fastened to a circuit board. The bolster plate can implement a loading mechanism via coupling with the heatsink 1708, which can apply a load to the processor 1706 such that the processor 1706 remains in communicative contact the processor socket. The bolster plate may include alignment pins (e.g., guideposts) that enable alignment of the processor 1706 and processor socket by aligning the alignment pins with the fasteners 1730 of the heatsink 1708. In other words, the heat transfer side 1734 of the heatsink 1708 can be thermally coupled to the IHS 1722 of the processor 1706 (e.g., while the processor 1706 is mounted to the processor carrier 1704). The resulting PH assembly 1700 can be mounted to the bolster plate via the fasteners 1730, which may include components, such as an example retention nut 1736 that includes an example passage hole 1738 and an example anti-tilt wire 1740. The alignment pins of the bolster plate may be aligned with the passage hole(s) 1738 of the retention nut(s) 1736. The load can be applied to the processor 1706 by compressing the processor 1706 against the processor socket as the fasteners 1730 are engaged with the alignment pins and torqued down. The anti-tilt wire(s) 1740 can be positioned in a locked position to prevent the heatsink 1708 from tilting or otherwise moving vertically (e.g., Z-direction) when torquing the retention nut(s) 1736.

In some examples, the PH assembly 1700 may include additional or alternative components. Further, the PH assembly 1700 can be arranged in other manners in additional or alternative examples. While the separator device 1702 is discussed as being part of the PH assembly 1700, the example separator device 1702 can be included or otherwise incorporated into other assemblies of an electronic device to separate additional or alternative semiconductor components.

During repair and upgrade, it is common for the processor 1706 to be removed from its circuit board. To remove the processor 1706, the PH assembly 1700 may be removed from the circuit board by removing the PH assembly 1700 from the processor socket assembly (e.g., and dismounting the processor 1706 from its socket). After the PH assembly 1700 is removed from the processor socket assembly, the PH assembly 1700 can be disassembled by removing the processor 1706 from the heatsink 1708 (e.g., and processor carrier 1704) via the example separator device 1702 (discussed in further detail below). In some examples, the separator device 1702 implements means for separating the processor 1706 from the heatsink 1708.

Figures 18A, 18B, 19:
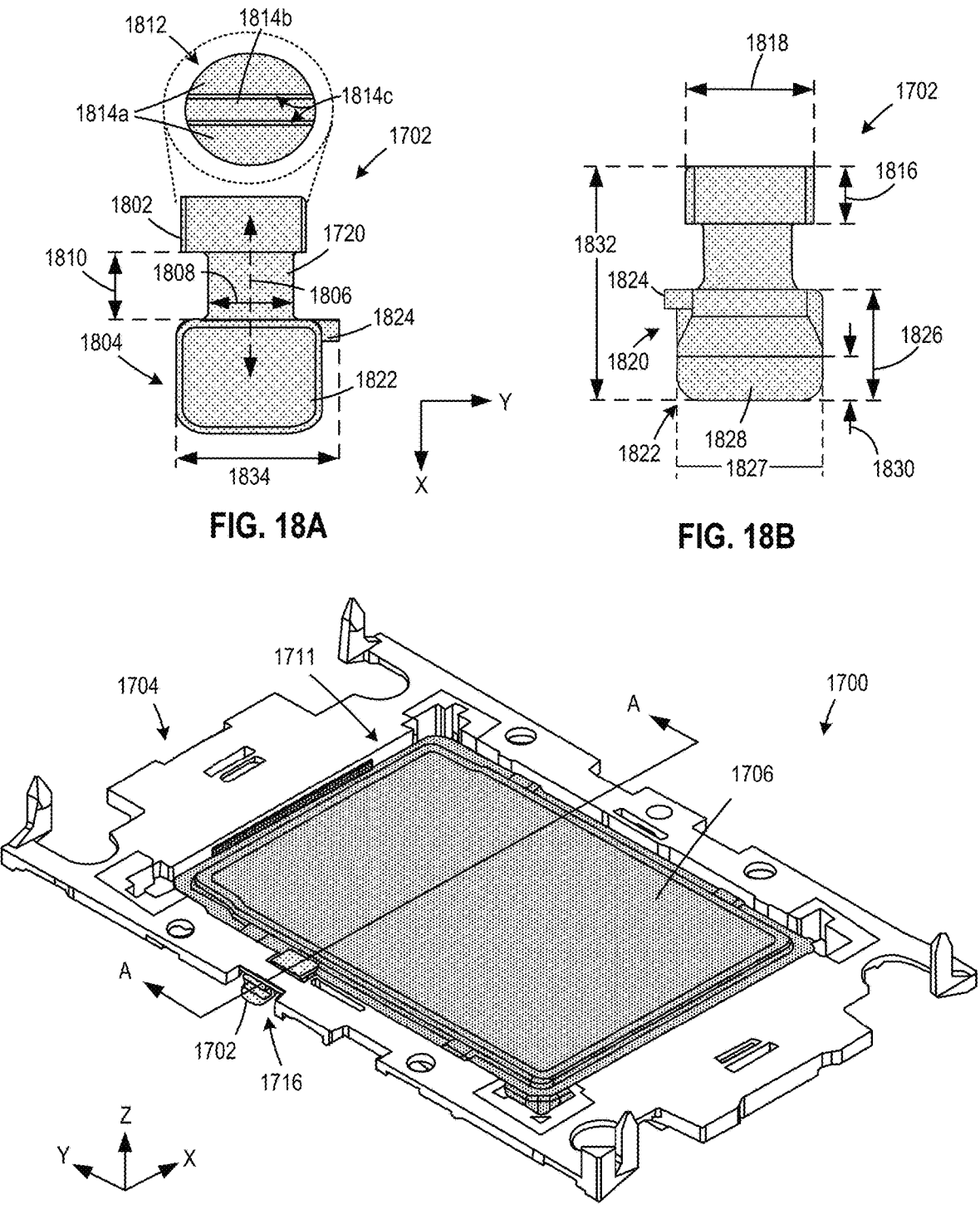
FIGS. 18A-18B illustrate different views of the example separator device of FIG. 17 in accordance with teachings of this disclosure.
FIG. 19 is an isometric view of an example sub-assembly of the PH assembly of FIG. 17, including the example processor carrier of FIG. 17 and the example separator device of FIGS. 17-18B.

FIGS. 18A and 18B illustrate different views of the example separator device 1702 of FIG. 17 constructed in accordance with teachings of this disclosure for breaking a TIM-2 bond layer to separate a processor (e.g., processor 1706 of FIG. 17) and a heatsink (e.g., heatsink 1708 of FIG. 17). The separator device 1702 includes the example shaft 1720, which is positioned between an example head 1802 and an example blade portion (e.g., wedge, etc.) 1804. In some examples, the head 1802 and the blade portion 1804 are positioned at opposite ends of the shaft 1720.

The shaft 1720 is to be positioned within the clip 1716 of the processor carrier 1704 of FIG. 17. In some examples, the shaft 1720 defines an example axis of rotation 1806 that extends along the X-axis. In some examples, at least a portion of shaft 1720 has a circular cross-section (e.g., perpendicular with the X-axis). In some such examples, the shaft 1720 is associated with an example shaft diameter 1808 measured relative to the axis of rotation 1806. However, the shaft 1720 may include other cross-sections in additional or alternative examples. In some examples, the shaft diameter 1808 corresponds to a clip diameter 1719 of the clip 1716. The shaft 1720 of FIG. 17 is associated with an example shaft length 1810. In some examples, the shaft length 1810 corresponds to an example width (e.g., example clip width 2002 of FIG. 23) of the clip 1716.

When the PH assembly 1700 of FIG. 17 is unmounted from a circuit board, the head 1802 of the separator device 1702 is positioned to be accessible to a service provider. The head 1802 includes an example drive 1812 to interface with a rotation tool. The drive 1812 includes or is otherwise defined by examples surfaces 1814, which define a shape that is to interface with a correspondingly shaped rotation tool. In some examples, the drive 1812 includes surfaces 1814 that define a shape capable of interfacing with the rotation tool. For example, the surfaces 1814 may define a cross-slot shape, which is capable of receiving a flathead screwdriver. In some examples, the surfaces 1814 defining the drive 1812 are to drive rotation of the separator device 1702 relative to the processor carrier 1704. In some examples, the head 1802 and/or the drive 1812 implement means for driving rotation of the separator device 1702.

In some examples, the drive 1812 is a protruding type of drive that receives a rotation having a corresponding recess. In some examples, the drive 1812 is a recess (e.g., trench) type drive that receives a rotation tool having a corresponding tip. For example, the surfaces 1814 of the drive 1812 of FIG. 18 includes example first surfaces 1814*a* and example second surface 1814*b*, each of which are substantially parallel with a diameter of the shaft 1720. The second surface 1814*b* is recessed relative to the first surfaces 1814*a*. The first surfaces 1814*a* are connected to the second surface 1814*b* via example third surfaces 1814*c*, which can be substantially orthogonal with respective first surfaces 1814*a* and the second surface 1814*b*. Thus, the surfaces 1814*a-c* of the drive 1812 of FIG. 18 define a slotted (e.g., flathead) shape. It is understood, however, that the surfaces 1814*a-c* of the drive 1812 can be structured to define any suitable drive shape that enables an interfaced rotation tool to apply a rotational force to the separator device 1702. Other possible shapes include, but are not limited to, cross-slotted (e.g., Phillips), pozidriv, tri-wing, Allen, Allen security, star (e.g., Torx®), square (e.g., Robertson), clutch, spanner, hex (e.g., hexagon), etc. The drive 1812 can be applied to the head 1802 using an additive manufacturing process and/or a subtractive manufacturing process.

The head 1802 is associated with an example height 1816. In some examples, the surfaces 1814 of the drive 1812 may define a recess that is associated with a depth less than the height 1816 of the head 1802. In some examples, the surfaces 1814 of the drive 1812 may define a protrusion that extends beyond the height 1816 of the head. In some examples, the head height 1816 of the head is less than a dimension of the frame 1710 of the processor carrier 1704 such that the head 1802 does not extend beyond the outer edge 1712 of the frame 1710 (described in further detail below).

The head 1802 is associated with an example head width 1818, which corresponds to a longest dimension of the head 1802 relative to the Y-axis. In FIG. 18B, for example, the head 1802 is substantially circular and, thus, the head width 1818 corresponds to a diameter of the head 1802. In some examples, the head 1802 is associated with another shape, such as is illustrated in FIG. 22. Thus, the width 1818 may be associated with another dimension. In some examples, the head width 1818 is larger than the diameter 1808 of the shaft 1720 to prevent the head 1802 from entering the clip 1716.

The example blade portion 1804 of the separator device 1702 is to interface with the processor 1706 and/or the heatsink and/or another hardware component. The blade portion 1804 of FIGS. 18A-18B includes an example support (e.g., guide, etc.) 1820, an example blade (e.g., wedge, paddle, etc.) 1822, and example extension (e.g., stop, notch, rotational stop, etc.) 1824. In some examples, the head 1802 and the blade 1822 are positioned at opposite ends of the separator device 1702 relative to the shaft 1720.

The example support 1820 is coupled to and extends from the shaft 1720. The support 1820 is structured to secure blade 1822 to the separator device 1702 and/or to help guide the processor 1706 during a removal/de-bonding process. The support 1820 include the example extension 1824 which is structured to prevent the blade portion 1804 from entering the clip 1716 and/or to limit rotation of the separator device 1702 (e.g., to implement a rotational stop). In some examples, the extension 1824 implements a rotational stop and/or a means for stopping rotation of the separator device 1702. The head width 1818, which is larger than the diameter 1808 of the shaft 1720, and the extension 1824 and support 1820 combination keep the separator device 1702 in a specific position relative to the clip 1716, relative to the processor carrier 1704, and relative to the X-Y-Z coordinates. While the separator device 1702 is positioned within the clip 1716, the separator device 1702 is to rotate relative to the axis of rotation 1806, which is substantially parallel with the X-axis. In some examples, the support 1820, the blade 1822, and the extension 1824 are integrally formed.

The blade 1822 is coupled to the support 1820. The blade 1822 is associated with a plane that corresponds to the X-Y plane. In some examples, the plane may be substantially perpendicular with the shaft diameter 1808. However, the blade 1822 can be oriented in any suitable manner that enables the blade 1822 to interface with the processor 1706 in operation. The blade 1822 is associated with an example blade length 1826 and an example blade width 1827. In some examples, the blade length 1826 and/or blade width 1827 can be based on different factors, such as a size of a component (e.g., the processor carrier 1704, the edge 1724, etc.), a rotational force needed to separate the processor 1706 and the heatsink 1708, etc. In the illustrated example, the blade width 1827 is greater than the blade length 1826. However, in other examples, the blade width 1827 is equal to or smaller than the blade length 1826.

The blade 1822 of FIG. 18B includes an example tip surface 1828, which is a surface of the blade 1822 that is to interface with an edge 1724 of the IHS 1722 of the processor 1706. In some examples, the tip surface 1828 is part of an example blade tip that is to fit between the edge 1724 of the IHS 1722 and the heatsink 1708. In some examples, the tip surface 1828 is associated with an example tip length 1830, which is smaller than a blade length 1826 of the blade 1822. In some examples, the blade 1822 and/or the tip surface 1828 implement means for forcing the processor 1706 away from the heatsink 1708 (e.g., in response to the rotation of the separator device 1702). In some examples, the tip length 1830 is determined based on a rotational force needed to separate the processor 1706 and the heatsink 1708, etc.

The separator device 1702 is associated with an example length 1832 (illustrated in FIG. 18B) and an example width 1834 (illustrated in FIG. 18A). The length 1832 is a largest dimension of the separator device 1702 relative to the X-axis in the X-Y plane. For example, the length 1832 in FIG. 18B extends from an outermost surface 1814 of the head 1802 to an edge of the blade 1822 adjacent the tip surface 1828. The length 1832 can be any suitable length that enables the blade 1822 to contact the processor 1706.

The width 1834 is a largest dimension of the separator device 1702 relative to the Y-axis in the X-Y plane. For example, the width 1834 in FIG. 18A extends from an edge of the blade 1822, along a width of the blade 1822, towards an edge of the support 1820. The width 1834 is larger than the diameter 1808 of the shaft 1720. For example, the width 1834 of the separator device 1702 may be defined by a distance measured from an example first edge of the separator device 1702 to an example second edge of the separator device 1702. In some examples, the first edge is a furthest edge from the axis of rotation 1806 in a first direction (e.g., a −Y direction) that is perpendicular to the axis of rotation and the second edge is a furthest edge from the first edge in second direction (e.g., a +Y direction) that is opposite and parallel to the first direction. In some examples, the width 1834 can be less than approximately 6 millimeters (mm) (e.g., approximately 5.5 mm).

The example separator device 1702 is associated with a numerous dimensions that ensure the separator device 1702 occupies a limited amount of space in the processor carrier 1704 and the PH assembly 1700 in general. The length 1832 and the width 1834 are significantly smaller than dimension of the release lever, discussed above. Whereas the width 1834 of the separator device 1702 measured relative to the blade 1822 can be less than approximately 6 mm, a width of the release lever relative to a blade is approximately 33.8 mm. As disclosed herein, approximately refers to a measurement that is within 10% of a stated measurement.

The separator device 1702 can be formed of any suitable material, such as a metal, a plastic, a high-end exotic material, etc. In some examples, the material used to form the separator device 1702 depends on an application of the PH assembly 1700. In some example, the head 1802, the blade portion 1804, and/or the shaft 1720 can be formed of different materials.

The separator device 1702 can be configured in a variety of manners other than those described herein. For example, the length 1832 of the separator device 1702 can be longer of shorter in some examples (e.g., to account for a different cam angle). In some examples, the blade 1822 extends from the shaft 1720 such that the plane defined by the blade 1822 aligns with (e.g., colinear with) the axis of rotation 1806 defined by the shaft 1720. In some examples, the blade 1822 extends from the shaft 1720 such that the plane defined by the blade 1822 is parallel to, but offset from the axis of rotation 1806 defined by the shaft 1720. In some examples, the configuration can be based at least partially on a rotational force needed to separate the processor 1706 and the heatsink 1708 and/or additional or alternative hardware components.

FIG. 19 is an isometric view of an example sub-assembly (e.g., portion) 1900 of the PH assembly 1700 of FIG. 17. The sub-assembly 1900 includes the example separator device 1702, the example processor carrier 1704, the example processor 1706, and the example clip 1716. The separator device 1702 is rotatably coupled to the processor carrier 1704. In the illustrated example of FIG. 19, the separator device 1702 is rotatably coupled to the processor carrier 1704 by positioning the separator device 1702 within the clip 1716 of the processor carrier 1704. As such, the separator device 1702 is removably coupled to the processor carrier 1704. In some examples, the removable coupling enables replacement of the separator device 1702. For example, the separator device 1702 may be removed from the processor carrier 1704 and replaced with another separator device 1702. The separator device 1702 may be replaced due to damage to the separator device 1702, a need for a different sized separator device 1702, and/or any other reason. The separator device 1702 can be rotatably coupled to the processor carrier 1704 in other suitable manners that enable the separator device 1702 to rotate relative to the processor carrier 1704. For example, the shaft 1720 of the separator device 1702 may be surrounded by an example socket (e.g., a sleeve, etc.), which can be attached to the processor carrier 1704.

While the sub-assembly 1900 of FIG. 19 includes one separator device 1702, the sub-assembly 1900 can include more separator devices 1702 in additional or alternative examples. For example, a relatively large processor 1706 (e.g., including numerous processor dies) may include multiple separator devices 1702. The processor carrier 1704 with multiple separator devices 1702 can include a same type of separator device 1702 and/or different typed-, sized-, and/or configured-separator devices 1702. In such examples, the processor carrier 1704 may include additional clips 1716 such that each separator device 1702 is positioned within a respective clip 1716. In some examples, the processor carrier 1704 can include more clips 1716 than separator devices 1702. In some examples, where a separator device 1702 is positioned on the processor carrier 1704, a clip 1716 is also positioned. In some examples, one or more separator device(s) 1702 can be positioned in a respective clip 1716 while one or more other separator device(s) 1702 are positioned in sockets and coupled to the processor carrier 1704. In some examples, the separator device 1702 is permanently attached to the processor carrier 1704. In some examples, the separator device 1702 is removable from the processor carrier 1704 via the clip 1716.

Figure 20:
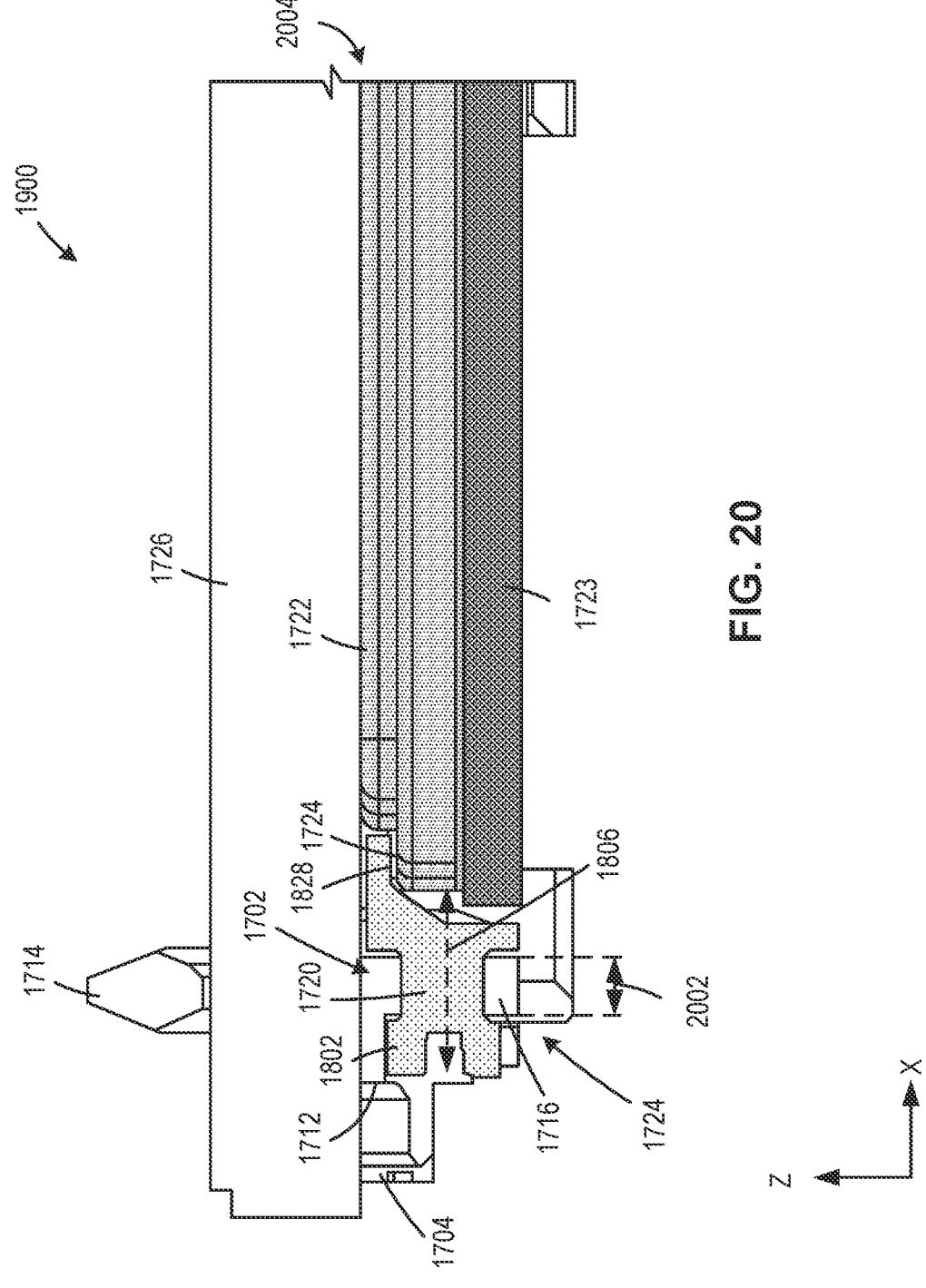
FIG. 20 is a partial cross-sectional view of the example sub-assembly of FIG. 19 along the line A-A.

FIG. 20 is a partial cross-sectional view of the sub-assembly 1900 of FIG. 19 along the line A-A. Thus, FIG. 20 includes the separator device 1702, the example processor carrier 1704, the example processor 1706, and the example clip 1716. For the sake of simplicity, the heatsink fins 1728 have been removed from the base 1726 of the heatsink 1708. As illustrated in FIG. 20, the shaft 1720 of the separator device 1702 is positioned within the clip 1716 of the processor carrier 1704. As illustrated in FIG. 20, the clip 1716 is associated with an example clip width 2002. In some examples, the shaft length 1810 of the shaft 1720 corresponds to the clip width 2002 to keep the separator device 1702 within the clip 1716.

As illustrated in FIG. 20, the processor 1706 includes the IHS 1722 coupled to the substrate 1723. The IHS 1722 is coupled to the heatsink 1708 at an example interface 2004 via a TIM-2 bonding layer. The IHS 1722 includes an edge 1724 defining a step of the IHS 1722. The tip surface 1828 of the separator device 1702 is positioned between a portion of the heatsink 1708 and a portion of the edge 1724 of the IHS 1722.

As noted above, the blade 1822 can be associated with a plane, which may be defined by the tip surface 1828. The separator device 1702 is also associated with the axis of rotation 1806, which is defined by the shaft 1720 of the separator device 1702. As illustrated in FIG. 20, the head 1802 is on-axis relative to the axis of rotation 1806 while the plane defined by the tip surface 1828 is off-axis relative to the axis of rotation 1806. During operation of the separator device 1702, the shaft 1720 and the head 1802 experience or otherwise undergo rotational motion about the axis of rotation 1806 while the blade 1822 pivots tangentially about the axis of rotation 1806. Such an orientation enables the tip surface 1828 of the blade 1822 to drive the processor 1706 away from the heatsink 1708 (e.g., breaking the TIM-2 bond layer) when a force is applied to the separator device 1702. That is, the processor 1706 is driven in a direction away from the heatsink 1708 as opposed to the heatsink 1708 being driven in a direction away from the processor 1706. In some examples, the clip(s) 1716 may be positioned adjacent the snap tab(s) (e.g., snap tab 2302) to further enable the processor 1706 being driven away from the heatsink 1708. In some examples, the plane defined by the tip surface 1828 may be on-axis relative to the axis of rotation 1806 to drive the heatsink processor 1706 and the heatsink 1708 away from each other (e.g., simultaneously). In some examples, the separator device 1702 may be configured to drive the heatsink 1708 away from the processor 1706.

As illustrated in FIG. 20, the head 1802 does not extend beyond an outer edge 1712 of the processor carrier 1704. Such an orientation leaves more room for other components to be positioned adjacent the processor carrier 1704. In some examples, the separator device 1702 is closer to a center of the processor carrier 1704 than the outer edge 1712 of the processor carrier 1704. However, it is understood that the separator device 1702 can be extend beyond the outer edge 1712 in some examples.

FIGS. 21A-21B are partial isometric views of the example sub-assembly 1900 of FIGS. 19-20, including illustrations of an example implementation of the separator device 1702 of FIGS. 17-20 to break the TIM-2 bond layer and remove the processor 1706 from the PH assembly 1700 in accordance with teachings of this disclosure. In operation, the implementation would be applied to the PH assembly 1700 and, as such, would include the heatsink 1708. However, the heatsink 1708 has been removed for the sake of simplicity.

FIG. 21A illustrates the sub-assembly 1900 in an example resting position 2100. The separator device 1702 is positioned within the clip 1716 of the processor carrier 1704, and the tip surface 1828 is positioned adjacent a portion of the edge 1724 of the IHS 1722. A service provider has provided a rotation tool 2102 and interfaced (e.g., inserted, connected) the example rotation tool 2102 with the drive 1812 of the separator device 1702. That is, the rotation tool 2102 contacts the separator device 1702 and does not contact the processor 1706, preventing damage to the processor 1706.

FIG. 21B illustrates the sub-assembly 1900 in an example operational position 2110. The service provider applies an example rotational force 2112 to the rotation tool 2102. The rotational force 2112 applied to the rotation tool 2102 is transferred to the drive 1812 of the separator device 1702. A resulting rotational force that is applied to the separator device 1702, causing the separator device 1702 to rotate within the clip 1716 relative to the axis of rotation 1806. The rotational force and resulting rotation of the separator device 1702 causes the tip surface 1828 to apply a force to portion of the edge 1724 of the IHS 1722, causing a pushing force the processor 1706. The pushing force on the processor 1706 may be applied and/or re-applied until the pushing force causes the TIM-2 bond layer to break, enabling the processor 1706 snap out of the processor carrier 1704 and move away from heatsink 1708. Thus, the processor 1706 can be removed from the PH assembly 1700 and serviced or replaced. In some examples, the processor carrier 1704 is removed from the heatsink 1708.

In some examples, the processor 1706 may be replaced with another processor 1706. For example, the processor 1706 may be inoperable, outdated, malfunctioning, slow, and/or a user may otherwise desire a different processor 1706. In some examples, the processor 1706 may need servicing before being returned to the PH assembly 1700. After at least partially dis-assembling the assembly 1700, the user may re-assemble the PH assembly 1700. In some examples, the user may use one or more new components (e.g., separator device 1702, processor 1706, heatsink 1708, processor socket 2104, etc.). In some examples, the service provider may perform a check on the separator device 1702 to determine whether to replace the separator device 1702 by removing the separator device 1702 from the clip 1716 and inserting another separator device 1702 into the clip 1716. In some examples, the user may re-use the components that were dis-assembled.

During re-assembly, the separator device 1702 may be positioned within the clip 1716 of the processor carrier 1704 (e.g., if the separator device 1702 is replaced). In some examples, the separator device 1702 remains within the processor carrier 1704. The processor 1706 may be coupled to the processor carrier 1704 by inserting the processor 1706 into the aperture 1711 until the processor 1706 engages the snap tabs 1302. The tip surface 1828 of the separator device 1702 can then be interfaced with the edge 1724 of the processor 1706. When re-assembling the PH assembly 1700, a new layer of TIM needs to be applied between the IHS 1722 and the heatsink 1708. The new layer of TIM may be applied after the processor 1706 is positioned within the processor carrier 1704 and the tip surface 1828 is interfaced with the edge 1724. The TIM may be applied to the IHS 1722 of the processor 1706, and the heat transfer surface 1734 of the heatsink 1708 can be interfaced with the TIM layer, generating the PH assembly 1700. In some examples, the PH assembly 1700 is then coupled to a processor socket assembly.

FIG. 22 includes another example separator device 2200 constructed in accordance with teachings of this disclosure. The separator device 2200 includes the shaft 1720 and the blade portion 1804 of the separator device 1702 of FIGS. 17-21B. For example, the separator device 2200 of FIG. 22 includes the support 1820, the blade 1822, and the extension 1824 of the blade portion 1804 of the separator device 1702 of FIGS. 17-21B. However, the separator device 2200 of FIG. 22 includes an example head 2202 that is different than the head 1802 of FIGS. 17-21B.

The example head 2202 of FIG. 22 includes another example drive 2204 having example surfaces 2206a-c. The drive 2204 of FIG. 22 is substantially perpendicular to the blade 1822, rather than substantially parallel. However, the drive 2204 can be oriented at any angle relative to the blade 1822 such that the service provider can interface the rotation tool 2102 with the drive 1812. In some examples, the head 2202 and/or the drive 2204 implement means for driving rotation of the separator device 2200.

The drive 2204 of FIG. 22 is non-circular. Rather, the drive 2204 include an example corner 2208 and an example flange 2210, each of which are adjacent each side of an example arc 2212. The arc 2212 is to be positioned adjacent the frame 1710 of the processor carrier 1704. The corner 2208 is positioned such that when the service provider causes rotation of the separator device 2200 in a first direction, the separator device 2200 stops rotating at the corner 2208. Such an orientation can prevent the separator device 2200 from over-rotating in the first direction. In some examples, the corner 2208 implements a rotational stop and/or a means for stopping rotation of the separator device 2200. In some examples, the orientation of the head 2202 of FIG. 22 can prevent the separator device 2200 from rotating over 90 degrees in the first direction. In some examples, such an orientation can make re-assembly of the PH assembly 1700 easier. The flange 2210 is positioned such that when the service provider causes rotation of the separator device 2200 in a second direction, the separator device 2200 stops rotating at the flange 2210. Such an orientation can prevent the separator device 2200 from over-rotating in the second direction. In some examples, the flange 2210 implements a rotational stop and/or a means for stopping rotation of the separator device 2200. In some examples, the orientation of the head 2202 of FIG. 22 can prevent the separator device 2200 from rotating over 45 degrees in the second direction. In some examples, the corner 2208 and/or the flange 2210 can make re-assembly of the PH assembly 1700 easier. In some examples, the separator device 2200 implements means for separating the processor 1706 from the heatsink 1708.

Figure 23A:
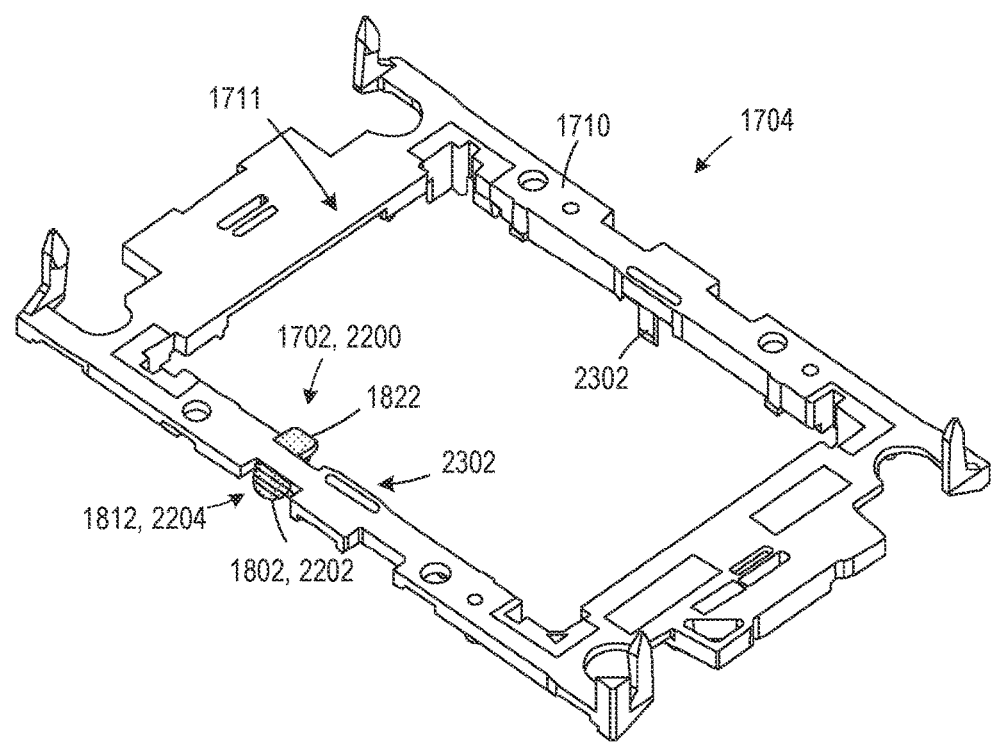
FIGS. 23A-23B illustrate different views of the example assembly of FIG. 20 structured in accordance with the teachings of this disclosure.
Figure 23B:
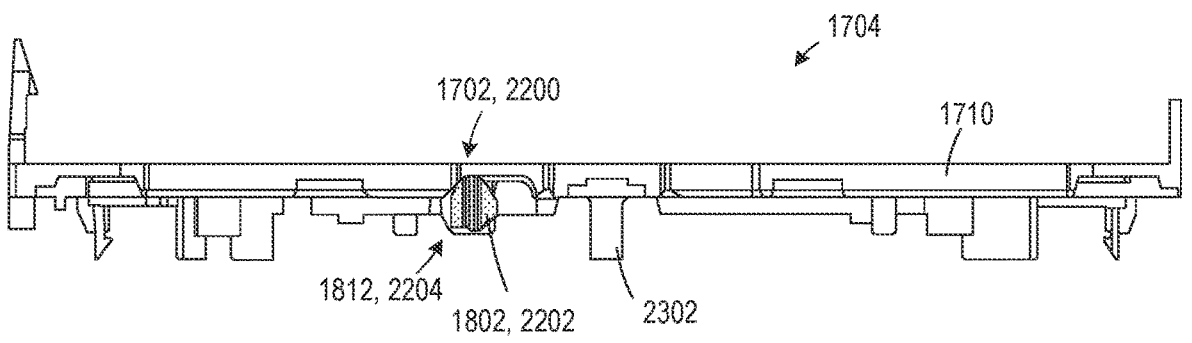

FIGS. 23A-23B illustrate different views of an example processor carrier 1704 and separator device 2200 assembly 2300 in accordance with the teachings of this disclosure. As illustrated in FIG. 23, processor carrier 1704 include example snap tabs (e.g., tab, latch, latch tab, mounting tab, attachment tab, etc.) 2302, which are to engage with the processor 1706 to retain the processor 1706 within the frame 1710 of the processor carrier 1704. The clip(s) 1716 of the processor carrier 1704 is positioned adjacent at least one of the snap tabs 2302. As noted above, the blade 1822 of the separator device 1702, 2200 may off axis relative to the axis of rotation 1806. When the separator device 2200 is rotated, the position of the blade 1822 enables the processor 1706 to be pushed away from the heatsink 1708 and the snap tabs 2302 to disengage with the processor 1706.

Figure 24A:
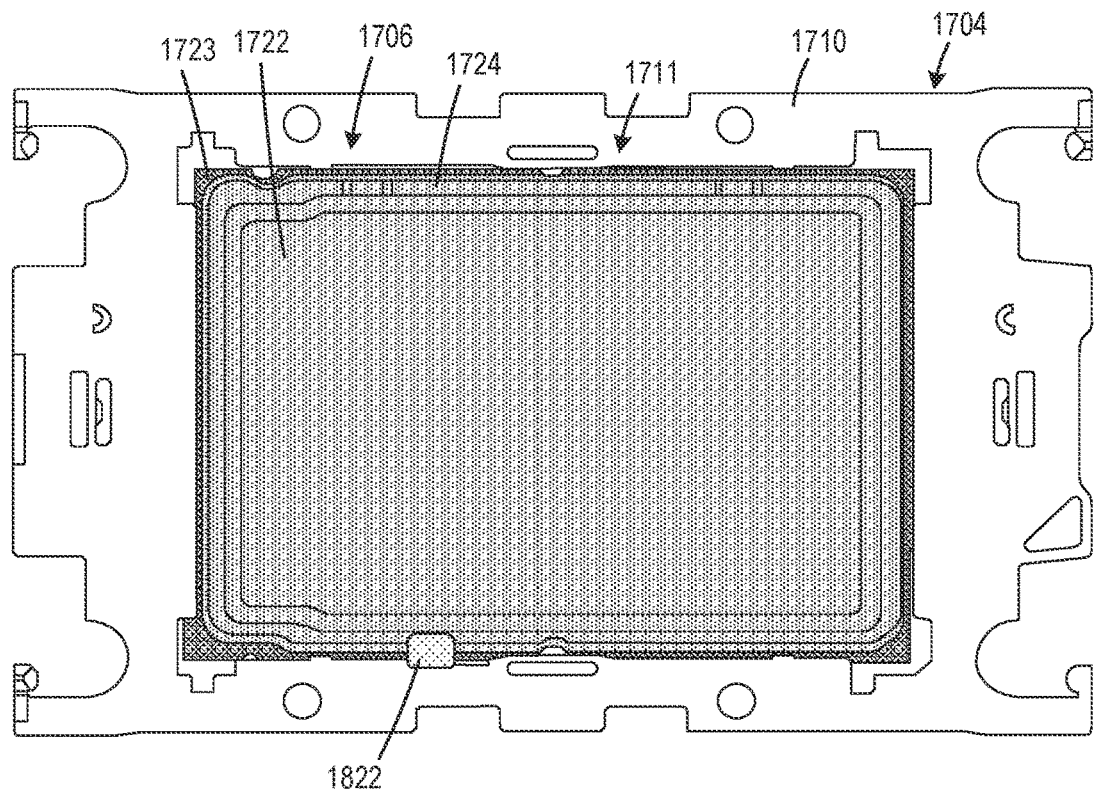
FIGS. 24A-24D illustrate different views of the example processor carrier and separator device in accordance with teachings of this disclosure.
Figure 24B:
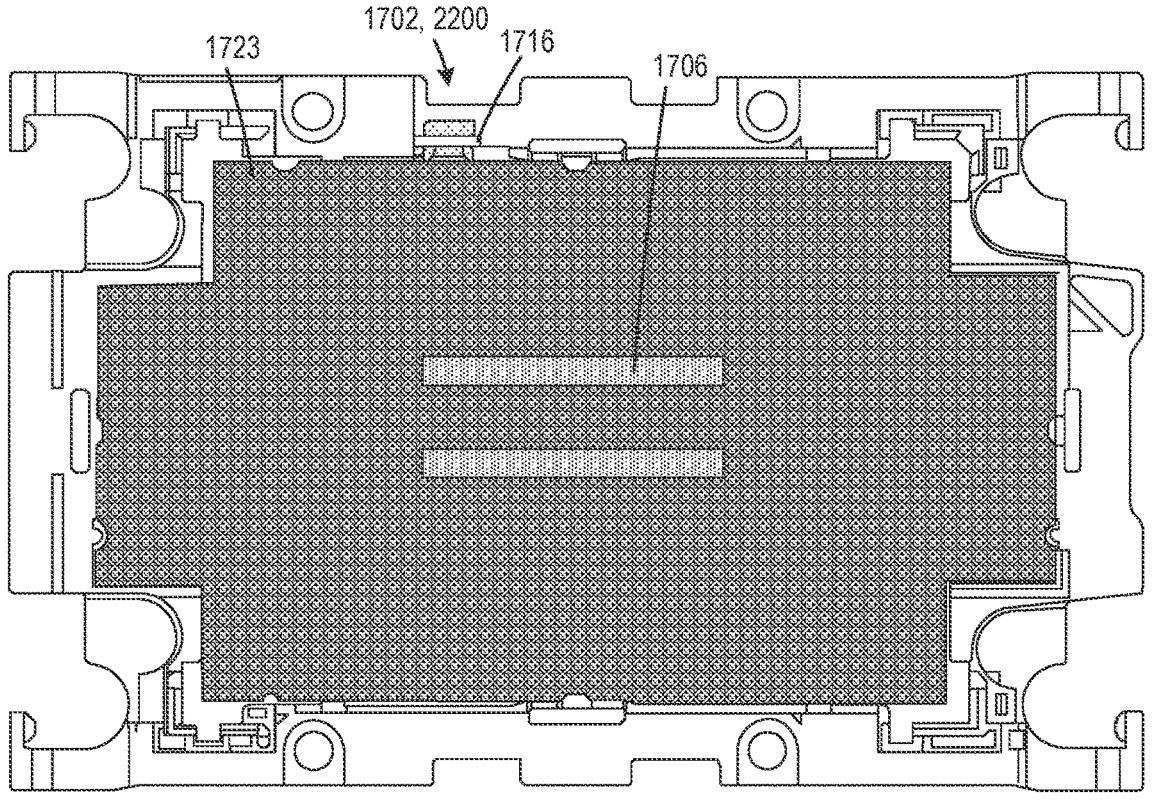
Figure 24C:
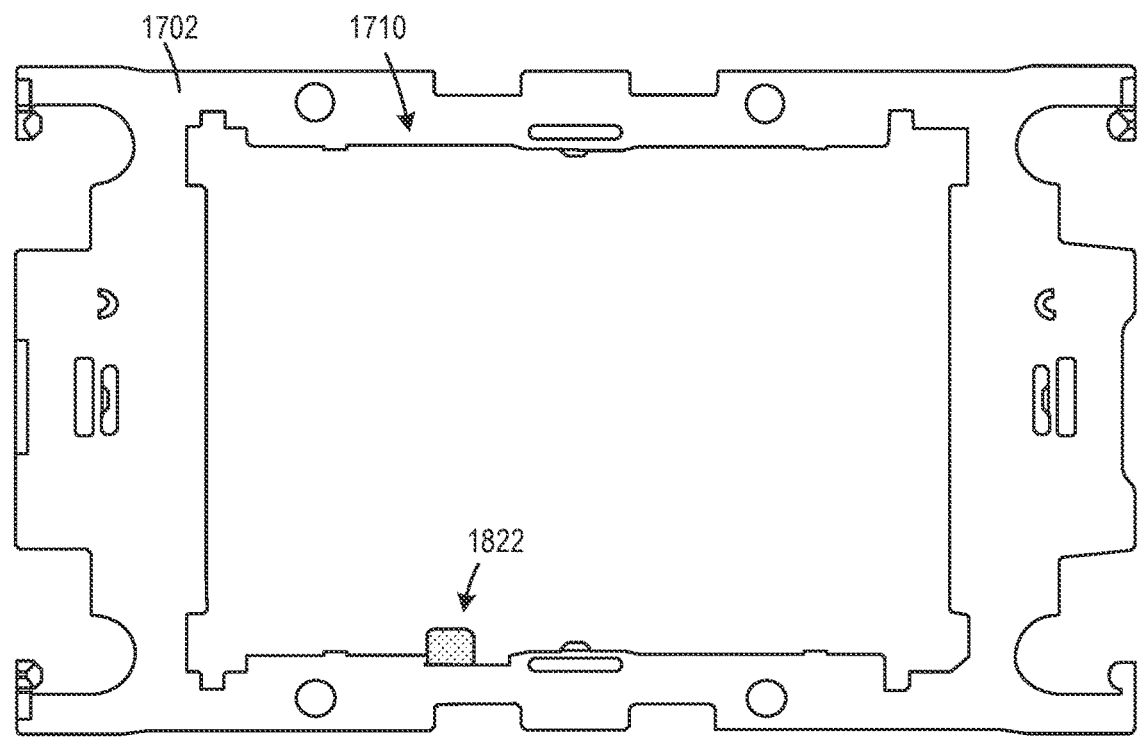
Figure 24D:
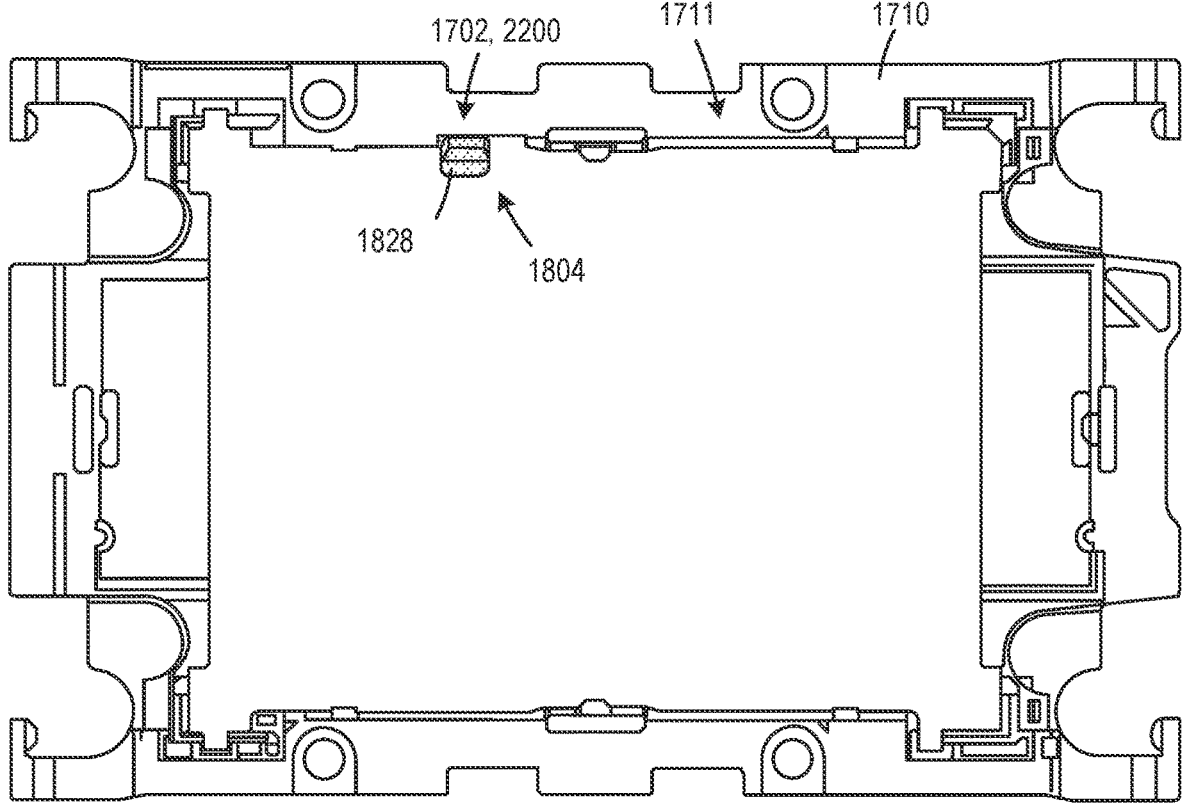

FIGS. 24A-24D illustrate different views of the example processor carrier 1704 with the integrated separator device 1702, 2200 in accordance with the teachings of this disclosure. FIGS. 24A-24B illustrates the processor 1706 positioned within the processor carrier 1704 having the integrated separator device 1702, 2200. FIGS. 24C-24D illustrate the processor carrier 1704 having the integrated separator device 1702, 2200 without the processor 1706. As illustrated in FIGS. 24B and 24D, the tip surface 1828 of the separator device 1702, 2200 interfaces with an edge 1724 of the processor 1706. FIGS. 24A-24D illustrate the small amount of space the separator device 1702, 2200 occupies relative to the processor carrier 1704 and the processor 1706. Further, FIGS. 24A-24D illustrate how the separator device

US 12,701,666 B2

35

(s) 1702, 2200 prevent the rotation tool 2102 from contacting the processor 1706 to prevent damage to the processor 1706.

FIG. 25 is a flowchart representative of an example method of creating an example processor carrier/separator device assembly in accordance with teachings of this disclosure. Although the example method of manufacture is described with reference to the flowchart illustrated in FIG. 25, many other methods may alternatively be used. For example, the order of execution of the blocks may be changed, and/or some of the blocks described may be combined, divided, re-arranged, omitted, eliminated, and/or implemented in any other way.

The example process begins at block 2502 by providing an example frame 1710 defining an example aperture 1711 to receive a semiconductor component (e.g., the processor 1706). For example, the frame 1710 may a frame of an example processor carrier 1704 for an example PH assembly 1700. In some examples, the frame 1710 may include one or more example snap tab(s) 2302 that engage with and retain the processor 1706 in the frame 1710.

At block 2504, the process includes integrating an example clip(s) 1716 onto the frame 1710, the clip 1716 defining an example passageway (e.g., passage, etc.) 1718 having an example first diameter 1719, the clip(s) 1716 associate with an example clip width. In some examples, the clip 1716 may be integrated with the frame 1710 via an additive manufacturing process and/or a subtractive manufacturing process. In some examples, the clip(s) 1716 may be coupled to the frame 1710.

At block 2506, the process includes providing a separator device 1702, 2200 having an example head 1802, 2202, an example blade portion 1804, and an example shaft 1720, the shaft 1720 having an example second diameter 1808 that corresponds to the first diameter 1719, wherein each of the head 1802, 2202 and the blade portion 1804 are associated with at least one dimension (e.g., in plane substantially parallel relative to the diameter of the shaft) that is larger than the second diameter 1808 of the shaft 1720, the shaft 1720 associate with an example shaft length 1810 that corresponds to the clip width of the clip 1716 on the frame 1710. For example, the second diameter 1808 may be slightly smaller, but substantially equal to the first diameter 1719 such that the second diameter 1808 fits within the first diameter 1719 and enable rotation of the shaft 1720 within the passageway 1718. In some examples, the shaft length 1810 is slightly larger, but substantially equal to the clip width such that the shaft 1720 fits within the clip 1716 and does not move linearly.

At block 2506, the process includes integrating an example drive 1812, 2204 in the head 1802, 2202 of the separator device 1702, 2200, the drive 1812, 2204 including example surfaces 1814a-c, 2206a-c defining at least one of a recess or a protrusion, the drive 1812, 2204 to interface with an example rotation tool 2102. For example, the surfaces 1814a-c, 2206a-c may form a shape (e.g., a slot, a cross-slot, a star, a hexagon, etc.) may correspond to a tip and/or socket of the rotation tool 2102. The surface 1814a-c, 2206a-c may connect with each other and be integral with the head 1802.

At block 2508, the process includes positioning the shaft 1720 of the separator device 1702, 2200 within the passageway 1718 of the clip 1716. By positioning the shaft 1720 within the passageway 1718, the process includes integrating the separator device 1702, 2200 with the processor carrier 1704.

During testing of an example implementation of an example separator device, performance of the separator device 1702, 2200 as disclosed herein was compared to performance of the screwdriver method. After undergoing a debonding process to break the TIM-2 bond layer using the screwdriver method without the example separator device 1702, 2200 disclosed herein, the processor experienced damage to substrate and IHS. However, after undergoing six cycles of the de-bonding process with the example separator device 1702, 2200 disclosed herein, the processor experience little to no damage caused. For example, the only change to the processor after the six cycles of the de-bonding process with the example separator device 1702, 2200 disclosed herein included faint markings on the IHS 1722. That is, the damage cause by the screwdriver method has been substantially resolved by incorporating the example separator device 1702, 2200 as disclosed herein with an example processor carrier 1704 and/or in an example PH assembly 1700. Further, the faint marks on the IHS are consistent, if not better, than results yielded from the known release lever.

During additional testing of an example implementation of an example separator device 1702, 2200 disclosed herein, operators were queried on user experience of the de-bonding process with the example separator device 1702, 2200 disclosed herein in terms of ease of use and effort needed to break the TIM-2 bond layer. Feedback from experienced technicians and engineers who have also used both the screwdriver method, the known release indicated that the example separator device 1702, 2200 disclosed herein provided a superior user experience as compared to other methodologies. The technicians and engineers indicated a preference for the example separator device 1702, 2200 disclosed herein moving forward.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example integrated separator devices for hardware component separation have been disclosed that provide a way to break a TIM-2 bond layer to separator a processor and a heatsink without damaging the processor. The example integrated separator devices disclosed herein occupy considerably less space on the processor carrier and yield a superior user experience to other known methodologies. By providing the example disclosed separator device(s) having an example drive to interface with a rotation tool, such as a screwdriver, prevents the rotation tool from contacting the processor thus preventing damage to the processor. Further, the example disclosed separator device(s) minimizes space consumption in a PH assembly.

Example integrated separator devices for hardware component separation are disclosed herein. Further examples and combination thereof include the following:

Example 1 includes a processor carrier having an inner edge, an outer edge; and a component separator rotatably coupled to the processor carrier, the component separator including a shaft, an entirety of the component separator closer to the center of the processor carrier than the outer edge is the center of the processor carrier.

Example 2 includes the apparatus of example 1, wherein the component separator includes a shaft defining a first length, the shaft disposed within a sleeve of the processor carrier, the sleeve defining a second length.

Example 3 includes the apparatus of one of examples 1-2, wherein the inner edge of the processor carrier defines an aperture to receive a processor, the processor carrier further including a snap tab extending from a surface of the processor carrier between the inner edge and the outer edge, the snap tab to engage with the processor; and wherein the sleeve of the processor carrier is adjacent the snap tab.

Example 4 includes the apparatus of one of examples 1-3, wherein the first length is substantially equal to the second length.

Example 5 includes the apparatus of one of examples 1-4, wherein the first length corresponding to the shaft is to define an axis of rotation of the component separator.

Example 6 includes the apparatus of one of examples 1-5, wherein the component separator includes a head and a blade at opposite ends of the shaft, the blade including a rotational stop to prevent rotation of the component separator beyond the rotational stop.

Example 7 includes the apparatus of one of examples 1-6, wherein the head and the shaft are to rotate relative to the axis of rotation, and the blade is to rotate tangentially about the axis of rotation.

Example 8 includes the apparatus of one of examples 1-7, wherein the shaft is associated with a diameter measured relative to the axis of rotation, and the head is associated with a dimension that is adjacent to the shaft and substantially parallel with the diameter of the shaft, the dimension to be larger than the diameter of the shaft to prevent the component separator from moving linearly towards the center of the processor carrier.

Example 9 includes the apparatus of one of examples 1-8, wherein the head is associated with a height, the height to be less than a distance from the inner edge to the outer edge of the processor carrier.

Example 10 includes the apparatus of one of examples 1-9, wherein the component separator includes a slot to drive rotation of the component separator relative to the processor carrier.

Example 11 includes the apparatus of one of examples 1-10, wherein the slot is shaped to receive a screwdriver.

Example 12 includes the apparatus of one of examples 1-11, wherein the component separator includes a protrusion to drive rotation of the component separator relative to the processor carrier.

Example 13 includes the apparatus of one of examples 1-12, wherein the protrusion is shaped to receive a wrench.

Example 14 includes the apparatus of one of examples 1-13, wherein the component separator includes a blade tip that is to fit between a processor coupled to the processor carrier and a heatsink coupled to the processor, the heatsink coupled to the processor via an adhesive bond, and wherein, during rotation of the component separator, the component separator applies a force to the processor in a first direction that is away from the heatsink to break the adhesive bond.

Example 15 includes the apparatus of one of examples 1-14, wherein the shaft defines an axis of rotation of the component separator, and a width of the component separator is defined as a distance measured from a first edge of the component separator to a second edge of the component separator, the first edge to be a furthest edge from the axis of rotation in a first direction that is perpendicular to the axis of rotation, the second edge to be a furthest edge from the first edge in second direction that is opposite and parallel to the first direction, the width to be approximately 5.5 millimeters.

Example 16 includes a method comprising providing a carrier to receive a processor, the carrier including a frame defining an opening; integrating a clip onto the frame; providing a separator device including a shaft positioned between a head and a wedge; integrating a drive into the head of the separate device, the drive defined by surfaces that are to interface with a rotation tool; and coupling the separator device and the carrier by positioning the shaft of the separator device within the clip.

Example 17 includes the method of example 16, wherein the clip includes a passageway having a first diameter, and the clip is associated with a clip width.

Example 18 includes the apparatus of one of examples 16-17, wherein the shaft is associated with a second diameter that corresponds to the first diameter such that the shaft is rotatably coupled to the carrier.

Example 19 includes the apparatus of one of examples 16-18, wherein the shaft of the separator device is associated with a length, the length to be substantially equal to the clip width of the clip, and wherein the positioning the shaft in the clip includes positioning the length of the shaft within the clip width.

Example 20 includes the apparatus of one of examples 16-19, wherein the carrier includes a snap tab extending from the frame, the snap tab to retain the processor; and wherein the integrating the clip onto the frame including integrating the clip adjacent the snap tab.

Example 21 includes the apparatus of one of examples 16-20, further including providing the processor; and attaching the processor to the frame by positioning the processor within the frame such that the snap tab engage with the processor; and positioning the separator device such that, during rotation of the separator device, the separator device applies a force to the processor in a first direction that is away from a heatsink coupled to the processor.

Example 22 includes the apparatus of one of examples 16-21, wherein the integrating the drive into the head includes generating the surfaces that define a slot within the head.

Example 23 includes the apparatus of one of examples 16-22, wherein the slot is shaped to receive a screwdriver.

Example 24 includes the apparatus of one of examples 16-23, wherein the integrating the drive into the head includes generating the surfaces that define a protrusion extending from the head.

Example 25 includes the apparatus of one of examples 16-24, wherein the protrusion is shaped to receive a socket.

Example 26 includes an apparatus comprising a frame defining an aperture to receive a semiconductor component; and a separator device coupled to the frame, the separator device including a first end including a blade; a second end having surfaces to interface with a rotation tool; and a shaft positioned between the first end and the second end.

Example 27 includes the apparatus of example 26, wherein the frame includes a clip, and the shaft of the separator device is positioned within the clip of the frame.

Example 28 includes the apparatus of one of examples 26-27, wherein the shaft is associated with a shaft length, the shaft length to correspond to a width of a passageway defined by the clip of the frame.

Example 29 includes the apparatus of one of examples 26-28, wherein the frame includes a tab to engage with the semiconductor component, and the clip is positioned adjacent the tab.

Example 30 includes the apparatus of one of examples 26-29, wherein the surfaces correspond to a recess in the second end of the separator device.

Example 31 includes the apparatus of one of examples 26-30, wherein the recess is defined by one of a slot, a cross-slot, a square, a hexagon, a star, or a tri-wing.

Example 32 includes the apparatus of one of examples 26-31, wherein the surfaces correspond to an extension in the second end of the separator device.

Example 33 includes the apparatus of one of examples 26-32, wherein the blade is to fit between the semiconductor component and a heatsink coupled to the semiconductor component, the heatsink coupled to the semiconductor component via an adhesive bond.

Example 34 includes the apparatus of one of examples 26-33, wherein the blade forces the semiconductor component to move away from the heatsink to break the adhesive bond when the separator device is rotated relative to the frame.

Example 35 includes the apparatus of one of examples 26-34, wherein the second end is defined by a shape that extends from the shaft, the shape including an arc positioned adjacent a flange in a first direction and a corner in a second direction, the flange to prevent the separator device from rotating more than a first amount of degrees in the first direction, the flange to prevent the separator device from rotating more than a second amount of degrees in the second direction.

Example 36 includes the apparatus of one of examples 26-35, wherein the separator device is formed of a metal.

Example 37 includes the apparatus of one of examples 26-36, further including a plurality of clips and a plurality of separator devices.

Example 38 includes an apparatus comprising means for carrying a first integrated circuit package, the first integrated circuit package to be coupled to a heatsink; means for separating the first integrated circuit package from the heatsink, the means for separating to be carried by the means for carrying, the means for separating including means for driving rotation of the means for separating relative to the means for carrying and means for forcing the integrated circuit package away from the heatsink in response to the rotation of the means for separating.

Example 39 includes the apparatus of example 38, wherein the means for carrying the first integrated circuit package includes means for retaining the first integrated circuit package, the means for retaining to engage with the first integrated circuit package, the means for separating to be positioned adjacent the means the for retaining.

Example 40 includes the apparatus of one of examples 38-39, wherein the means for driving rotation includes surfaces defining a recess within the means for driving rotation.

Example 41 includes the apparatus of one of examples 38-40, wherein the recess is defined by one of a slot, a cross-slot, a square, a hexagon, a star, or a tri-wing.

Example 42 includes the apparatus of one of examples 38-41, wherein the means for driving rotation includes surfaces defining a protuberance extending from means for driving rotation.

Example 43 includes the apparatus of one of examples 38-42, wherein an entirety of the means for separating is closer to a center of the means for carrying than an outer edge of the means for carrying.

Example 44 includes the apparatus of one of examples 38-43, wherein the means for forcing is to fit between the first integrated circuit package and the heatsink coupled to the first integrated circuit package, the heatsink coupled to the first integrated circuit package via a bond generated by a thermal interface material.

Example 45 includes the apparatus of one of examples 38-44, wherein the means for forcing forces the first integrated circuit package to move away from the heatsink to break the bond generated by the thermal interface material when the means for separating is rotated relative to the means for carrying.

Example 46 includes an example method for separating a component and a heatsink device comprising: providing a carrier having a separator device within a clip coupled to the carrier; providing a rotation tool; interfacing the rotation tool with a drive of the separator device, the drive defined by surfaces shaped to interface with the rotation tool; and applying a rotational force to the rotation tool to cause the separator device to rotate about an axis of rotation, the rotation of the separator device to cause a blade of the separator device to apply a force to the component within the carrier to separate the component from the heatsink device coupled to the component.

Example 47 includes the method of example 46, further including determining whether at least one of the separator device, the component, or the carrier includes damage during separation of the component and the heatsink; and in response to identifying the damage, replacing the at least one of the separator device, the component, or the carrier.

Example 48 includes the method of any one of examples 46-47, further including re-assembling the component and the heatsink device, the reassembling including: coupling the component within an aperture of the carrier; positioning the blade of the separator device adjacent the component such that the blade is able to interface with the component in response to the rotation of the separator device; applying a thermal interface material to the component; and coupling the carrier and the heatsink device such that a heat transfer surface of the heatsink device interfaces with the thermal interface material.

The following claims are hereby incorporated into this Detailed Description by this reference. Although certain example integrated separator device for hardware component separation have been disclosed herein, the scope of coverage of this patent is not limited thereto. On the contrary, this patent covers all separator device fairly falling within the scope of the claims of this patent.

What is claimed is:

1. An apparatus, comprising:
a processor carrier having an inner edge and an outer edge, the inner edge defining an aperture; and
a component separator rotatably coupled to the processor carrier, the component separator including a shaft, the shaft extending along a straight line from a first end of the shaft to a second end of the shaft, the first end at a beginning of a first portion of the component separator, the first portion wider than a diameter of the shaft, the second end at a beginning of a second portion of the component separator, the second portion wider than the diameter of the shaft, an entirety of the component separator closer to a center of the processor carrier than the outer edge is to the center of the processor carrier.

2. The apparatus of claim 1, wherein the shaft has a first length, the shaft is to be within a sleeve of the processor carrier, and the sleeve has a second length.

3. The apparatus of claim 2, wherein the aperture is to receive a processor, the processor carrier including a snap tab extending from a surface of the processor carrier between the inner edge and the outer edge, the snap tab to engage with the processor; and
wherein the sleeve of the processor carrier is adjacent the snap tab.

4. The apparatus of claim 2, wherein the first length is substantially equal to the second length.

5. The apparatus of claim 2, wherein the first length corresponding to the shaft is to define an axis of rotation of the component separator.

6. The apparatus of claim 5, wherein the first portion of the component separator includes a head and the second portion of the component separator includes a blade.

7. The apparatus of claim 6, wherein the head and the shaft are to rotate relative to the axis of rotation, and the blade is to rotate tangentially about the axis of rotation.

8. The apparatus of claim 6, wherein the head is associated with a height, the height to be less than a distance from the inner edge to the outer edge of the processor carrier.

9. The apparatus of claim 1, wherein the first portion of the component separator is wider than the shaft to prevent the component separator from moving linearly towards the center of the processor carrier.

10. The apparatus of claim 1, wherein the component separator includes a slot to drive rotation of the component separator relative to the processor carrier.

11. The apparatus of claim 1, wherein the component separator includes a protrusion to drive rotation of the component separator relative to the processor carrier.

12. The apparatus of claim 1, wherein the second portion of the component separator includes a blade tip that is to fit between a processor coupled to the processor carrier and a heatsink coupled to the processor, the heatsink coupled to the processor via an adhesive bond, and wherein, during rotation of the component separator, the component separator applies a force to the processor in a first direction that is away from the heatsink to break the adhesive bond.

13. The apparatus of claim 1, wherein the shaft defines an axis of rotation of the component separator, and a width of the component separator is a distance measured from a first edge of the component separator to a second edge of the component separator, the first edge to be a furthest edge from the axis of rotation in a first direction that is perpendicular to the axis of rotation, the second edge to be a furthest edge from the first edge in a second direction that is opposite and parallel to the first direction, the width to be approximately 5.5 millimeters.

14. A method comprising:
providing a carrier to receive a processor, the carrier including a frame defining an opening;
integrating a clip onto the frame;
providing a separator device including a straight shaft between a head and a wedge, the wedge having a length that extends along a plane containing a line corresponding to a central axis of the shaft, the head longitudinally aligned with an elongate length of the shaft such that the line passes through the head;
integrating a drive into the head of the separator device, the drive defined by surfaces that are to interface with a rotation tool; and
coupling the separator device and the carrier by positioning the shaft of the separator device within the clip.

15. The method of claim 14, wherein the clip includes a passageway having a first diameter, and the shaft is associated with a second diameter that corresponds to the first diameter such that the shaft is rotatably coupled to the carrier.

16. The method of claim 14, wherein the clip of the carrier is associated with a clip width and the shaft of the separator device is associated with a shaft length, the shaft length to be substantially equal to the clip width, the positioning of the shaft in the clip including positioning the shaft length within the clip width.

17. The method of claim 14, wherein the carrier includes a snap tab extending from the frame, the snap tab is to retain the processor; and the integrating of the clip onto the frame includes integrating the clip adjacent the snap tab.

18. The method of claim 17, including:
attaching the processor to the frame by positioning the processor within the frame such that the snap tab engages with the processor; and
positioning the separator device such that, during rotation of the separator device, the separator device applies a force to the processor in a first direction that is away from a heatsink coupled to the processor.

19. An apparatus comprising:
a frame defining an aperture to receive a semiconductor component; and
a separator device to be coupled to the frame, the separator device including:
a first end portion including a blade;
a second end portion having surfaces to interface with a rotation tool; and
a shaft extending in a straight line along a central axis, the shaft extending from the first end portion to the second end portion, the first end portion being wider than a diameter of the shaft in a direction perpendicular to the central axis, the second end portion being wider than the diameter of the shaft in a direction perpendicular to the central axis.

20. The apparatus of claim 19, wherein the frame includes a clip, and the shaft of the separator device is within the clip of the frame.

21. The apparatus of claim 20, wherein the shaft is associated with a shaft length, the shaft length to correspond to a width of a passageway defined by the clip of the frame.

22. The apparatus of claim 19, wherein the blade is to fit between the semiconductor component and a heatsink coupled to the semiconductor component, the heatsink coupled to the semiconductor component via an adhesive bond.

23. The apparatus of claim 22, wherein the blade is to force the semiconductor component to move away from the heatsink to break the adhesive bond when the separator device is rotated relative to the frame.

24. The apparatus of claim 19, wherein the first end portion includes a stop protruding from a side of the blade, the stop to inhibit rotation of the separator device in a first direction while permitting rotation of the separator device in a second direction opposite the first direction.

25. The apparatus of claim 19, wherein the second end portion has a shape that is non-symmetrical about an axis of rotation, the axis of rotation colinear with the central axis of the shaft, the shape including an arced portion and a corner defined between two planar portions.

\* \* \* \* \*